(12) United States Patent
Hamamoto

(10) Patent No.: US 8,482,044 B2
(45) Date of Patent: Jul. 9, 2013

(54) SEMICONDUCTOR MEMORY DEVICE INCLUDING FERROELECTRIC CAPACITOR

(75) Inventor: Takeshi Hamamoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 503 days.

(21) Appl. No.: 12/721,245

(22) Filed: Mar. 10, 2010

(65) Prior Publication Data

US 2011/0062504 A1   Mar. 17, 2011

(30) Foreign Application Priority Data

Sep. 15, 2009   (JP) .................................. 2009-213309

(51) Int. Cl.
*H01L 21/02* (2006.01)

(52) U.S. Cl.
USPC ............. 257/295; 257/E27.104; 257/E21.664

(58) Field of Classification Search
USPC . 257/295, E27.104, E21.663, E21.664; 438/3
See application file for complete search history.

(56) References Cited

U.S. PATENT DOCUMENTS

| | | | |
|---|---|---|---|
| 5,721,700 A * | 2/1998 | Katoh | ............................ 257/295 |
| 6,172,898 B1 | 1/2001 | Kajiyama | |
| 2004/0061144 A1 | 4/2004 | Sato et al. | |
| 2004/0090812 A1* | 5/2004 | Takashima | ..................... 365/145 |
| 2009/0213637 A1* | 8/2009 | Lee et al. | ....................... 365/149 |
| 2010/0163943 A1* | 7/2010 | Ozaki | ........................... 257/295 |
| 2011/0033955 A1* | 2/2011 | Kang | ................................ 438/3 |

FOREIGN PATENT DOCUMENTS

| | | |
|---|---|---|
| JP | 2000-252437 | 9/2000 |
| JP | 2004-119937 | 4/2004 |

OTHER PUBLICATIONS

H.J. Joo et al., "Highly Reliable and Mass-productive FRAM embedded Smartcard using Advanced Integration Technologies," 2004 Symposium on VLSI Technology, Digest of Technical Papers, pp. 148-149.
Background Art Information.

\* cited by examiner

*Primary Examiner* — Matthew Landau
*Assistant Examiner* — Colleen E Snow
(74) *Attorney, Agent, or Firm* — Knobbe, Martens, Olson & Bear, LLP

(57) ABSTRACT

An aspect of the present disclosure, there is provided semiconductor memory device including a ferroelectric capacitor and a field effect transistor as a memory cell, the ferroelectric capacitor including a lower electrode connected to one of the pair of the impurity diffusion layers, a bit line formed below the lower electrode, wherein each of the memory cells shares the bit line contact with an adjacent memory cell at one side in the first direction to connect to the bit line, and three of the word lines are formed between the bit line contacts in the first direction.

11 Claims, 24 Drawing Sheets

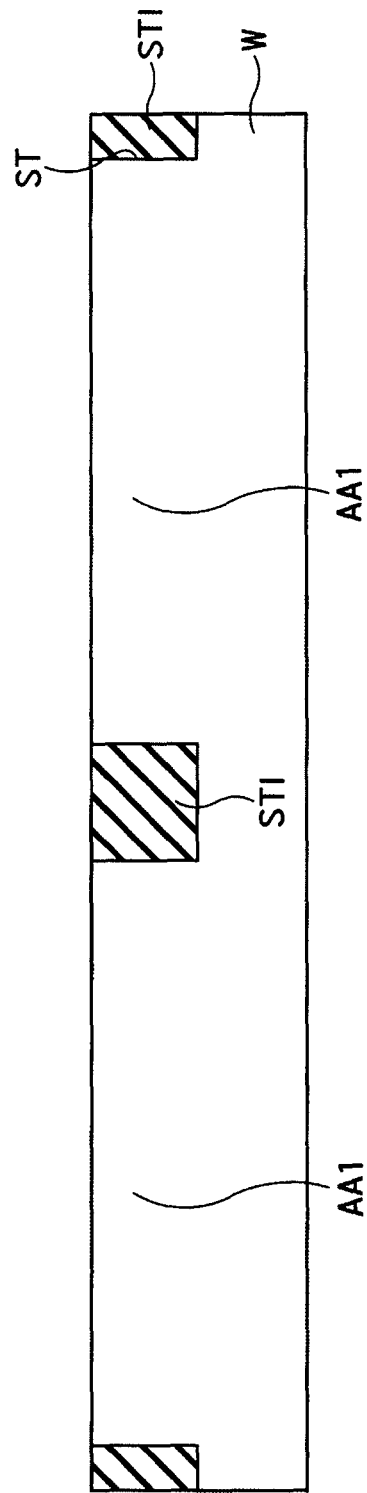
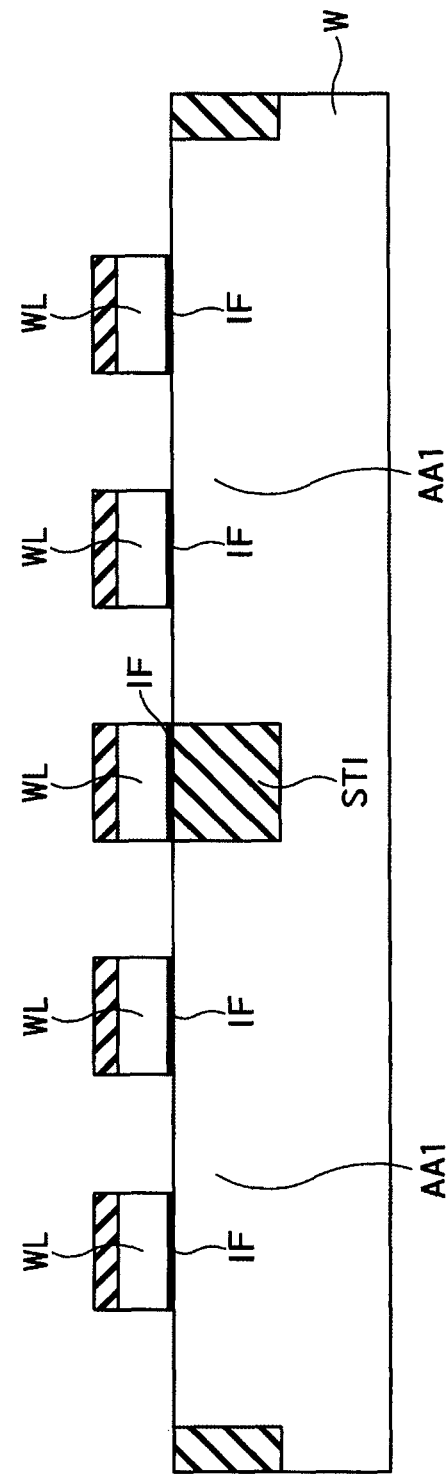
FIG.7A
FIG.7B

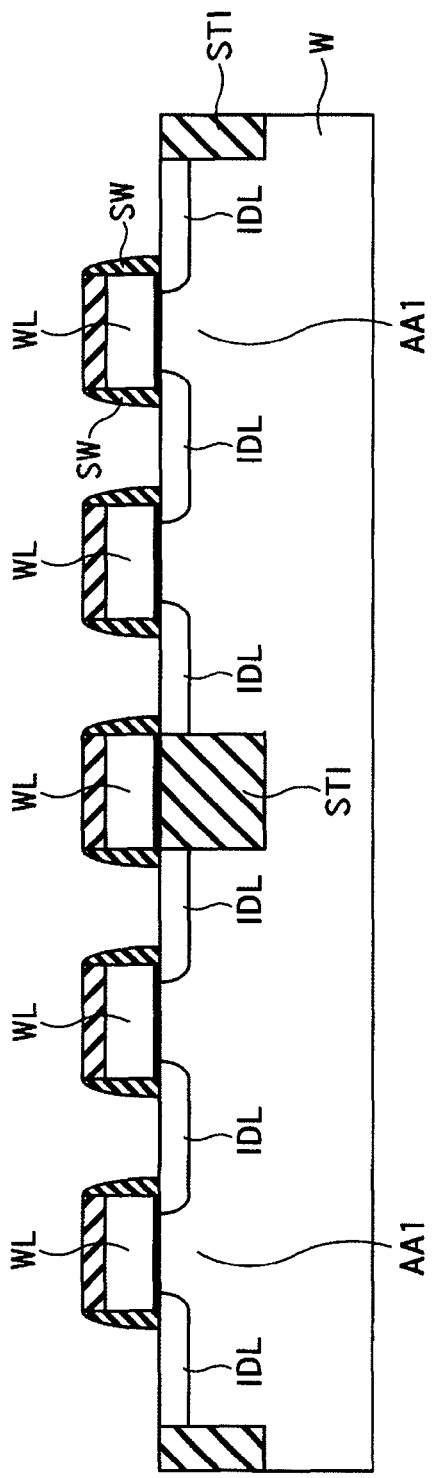
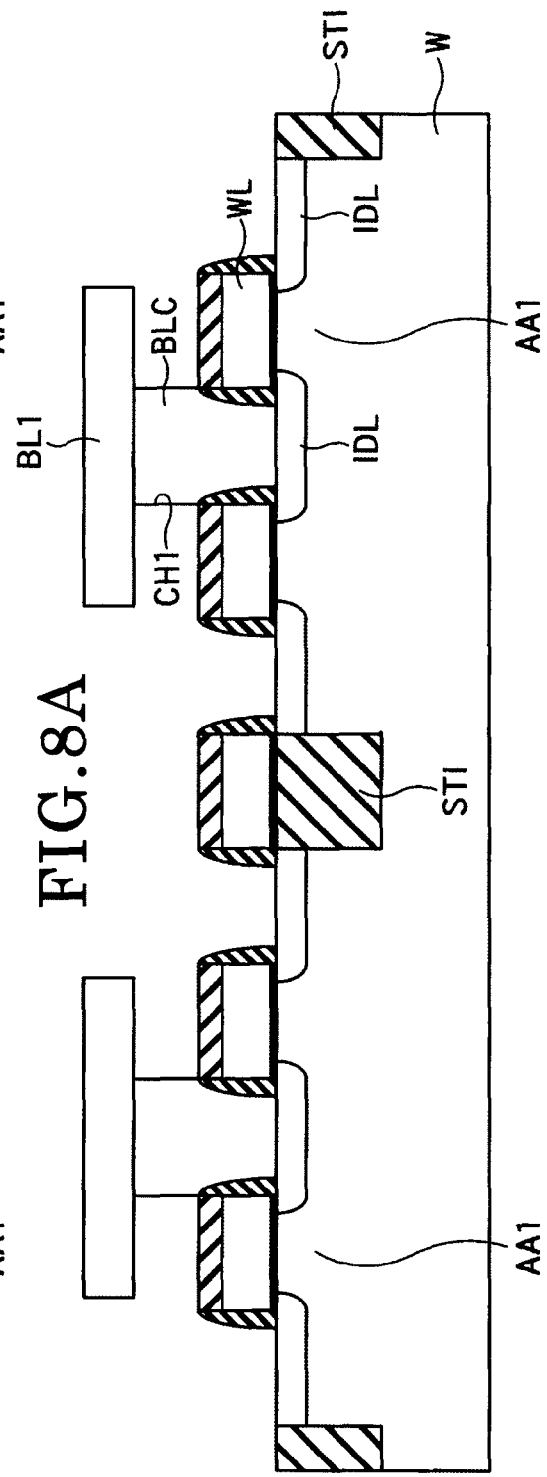
FIG.8A
FIG.8B

SEMICONDUCTOR MEMORY DEVICE INCLUDING FERROELECTRIC CAPACITOR

CROSS REFERENCE TO RELATED APPLICATION

This application is based upon and claims the benefit of priority from prior Japanese Application Publication No. 2009-213309, filed on Sep. 15, 2009, the entire contents of which are incorporated herein by reference.

TECHNICAL FIELD

Exemplary embodiments described herein relate to a semiconductor memory device including a ferroelectric capacitor.

BACKGROUND

Ferroelectric memories which use a ferroelectric film as a capacitor insulating film recently have received attention as a highly-integrated nonvolatile memory that utilizes polarization reversal and remanent polarization of the ferroelectric film.

As such a ferroelectric memory, a capacitor over bit line (COB) cell structure in which a capacitor insulating film is arranged above a bit line is proposed in Japanese Patent Application Publication No. 2004-119937 and H. J. Joo, et. al., 2004 Symposium on VLSI Technology Digest of Technical Papers, pages 148-149, for example.

According to the layout proposed by H. J. Joo, et. al., for example, in rectangular-shaped memory cells arranged to form a matrix, two word lines are arranged in a long side direction per unit memory cell (see FIG. 3). One of the word lines is a select word line, and the other of the word lines is a passing word line. One bit line is arranged in a short side direction per unit memory cell. Each wiring is ideally formed with the minimum processing dimension. Accordingly, when the minimum processing dimension is referred to as a feature size (hereinafter, simply denoted by "F"), the size of a unit cell is 4 F on the long side and 2 F on the short side, and the area of the unit cell is 2 F×4 F=8 $F^2$.

The capacitor size in the layout by H. J. Joo, et. al. is 3 F on the long side and 1 F on the short side, and the area of the capacitor is 3 $F^2$.

Here, there is a problem that the capacitor layout by H. J. Joo, et. al. has a large ratio of 3:1 between the long side and the short side. It is generally known that characteristic degradation occurs in a ferroelectric film during the manufacturing process due to plasma damage, hydrogen reduction, or the like. The characteristic degradation occurs in an edge region of the ferroelectric film. Accordingly, the longer perimeter length of the capacitor may cause the more characteristic degradation of the ferroelectric film.

One of specific examples of the characteristic degradation is that a signal amount from a memory cell decreases and thus reliability as a memory element decreases.

Assume that a region extending by (¼)F from each edge is a region not contributing to a signal due to characteristic degradation in the manufacturing process. In the capacitor with an area of 3 $F^2$, a region having signals is reduced to 1.25 $F^2$. In other words, the signal amount from the capacitor is reduced to 42% due to the influence of the characteristic degradation in the manufacturing process.

The size of the region to be damaged is constant independent of the size of the capacitor. Accordingly, the decrease in signal amount under the influence of the characteristic degradation becomes larger as the minimum processing dimension is reduced.

SUMMARY

An aspect of the present disclosure, there is provided a semiconductor memory device including a ferroelectric capacitor comprising, a substrate, a field effect transistor including a word line formed on the substrate via an insulating layer and impurity diffusion layers formed to be paired in an element region in a surface layer of the substrate, the word line being interposed between the impurity diffusion layers to be paired, a ferroelectric capacitor formed above the substrate, the ferroelectric capacitor including a lower electrode connected to one of the pair of the impurity diffusion layers, a ferroelectric film on the lower electrode, and an upper electrode on the ferroelectric film, and a bit line formed below the lower electrode, the bit line connecting to the other of the pair of impurity diffusion layers via a bit line contact, wherein a memory cell is constituted with the field effect transistor and the ferroelectric capacitor, a first memory cell group in a first direction with a predetermined pitch are constituted with each of the memory cells in a plurality of second memory groups in a second direction, each of the memory cells shares the bit line contact with an adjacent memory cell at one side in the first direction to connect to the bit line, and three of the word lines are formed between the bit line contacts in the first direction.

An another aspect of the present disclosure, there is provided a method for fabricating a semiconductor memory device, comprising, forming an element region isolated with an element isolation region on a substrate, forming a gate insulator on the element region, forming a silicon film on the gate insulator, selectively removing the silicon film and the gate insulator to form a gate structure including a word line, forming an impurity diffusion layers at both sides on the substrate to interpose the gate structure forming a sidewall insulator on a sidewall of the gate structure, forming a first interlayer insulator above the substrate, forming a first contact hole in the first interlayer insulator on one of the impurity diffusion layers, embedding a first conductive film into the first contact hole, forming a bit line on the first conductive film to contact to the one of the impurity diffusion layers forming a second interlayer insulator above the substrate, forming a second contact hole in the second interlayer insulator on the other of the impurity diffusion layers, embedding a second conductive film into the second contact hole, forming a lower electrode, a ferroelectric film and an upper electrode on the substrate in order, selectively removing the upper electrode, the ferroelectric film and the lower electrode to form a ferroelectric capacitor constituted with the lower electrode, the ferroelectric film and the upper electrode, the lower electrode being formed above the second conductive film, forming a third interlayer insulator above the substrate, and forming a plate line on the third interlayer insulator to connect to the upper electrode.

BRIEF DESCRIPTION OF THE DRAWINGS

FIGS. 7A and 7B are cross-sectional views explaining a manufacturing method of the ferroelectric memory shown in FIG. 1;

FIGS. 8A and 8B are cross-sectional views explaining the manufacturing method of the ferroelectric memory shown in FIG. 1;

DETAILED DESCRIPTION

Figure 1:
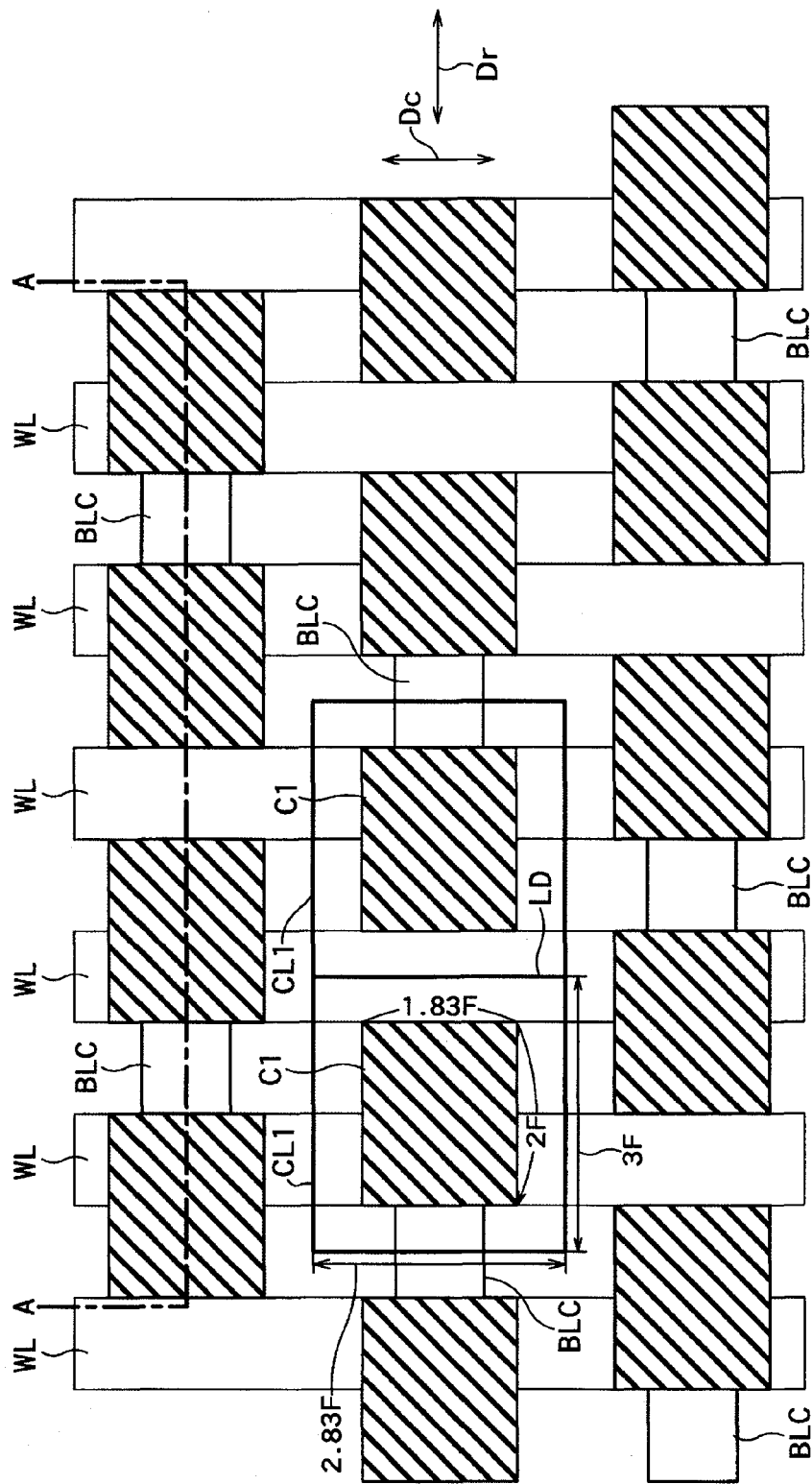
FIG. 1 is a plan view showing a principal portion in a layout of a semiconductor memory device according to a first embodiment of the invention.

Hereinafter, embodiments of the invention will be described in detail with reference to the accompanying drawings. The same reference numerals are given to the same portions in the drawings, and the overlapped portions will be described if necessary.

First Embodiment

Figure 2:
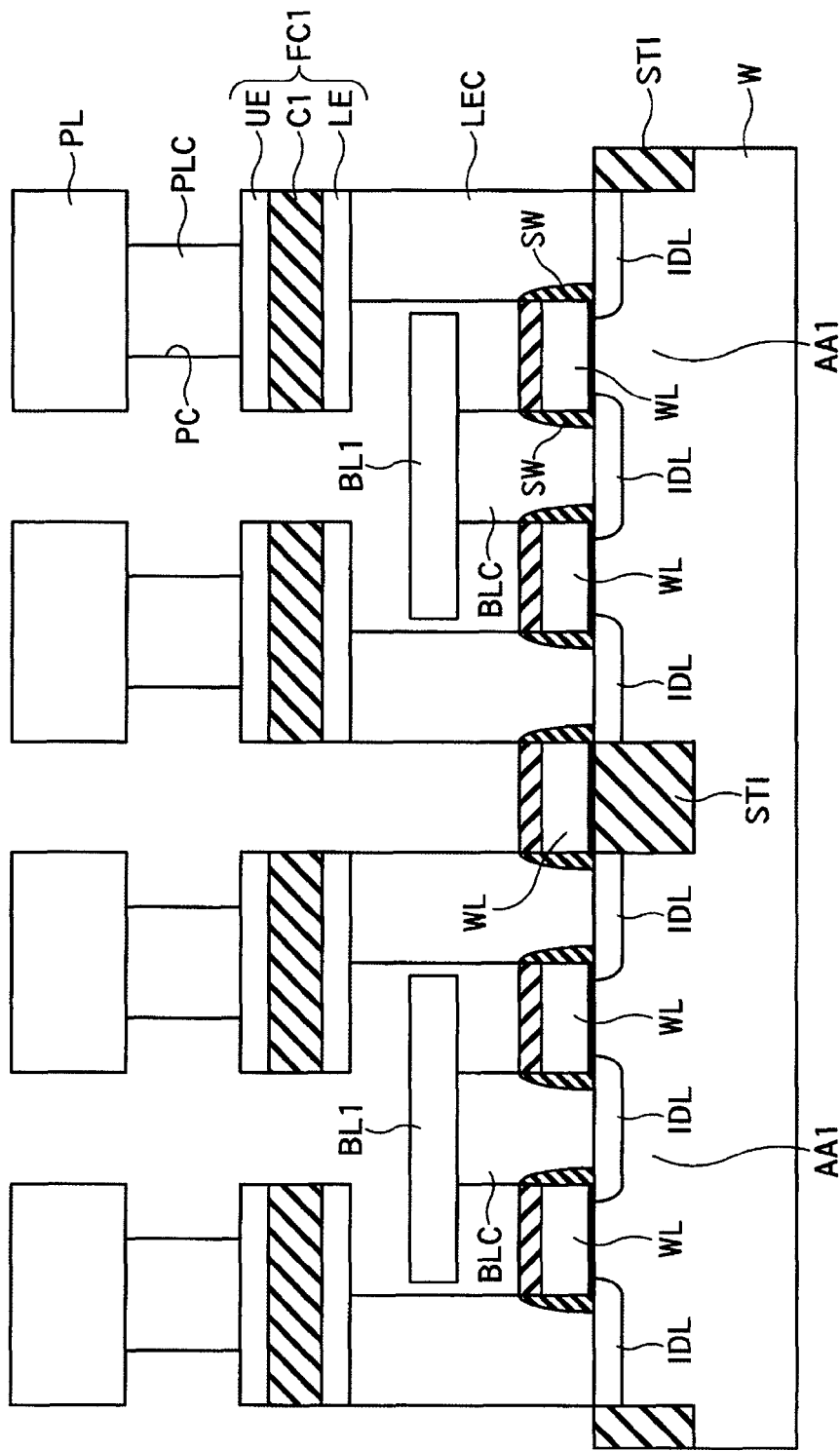
FIG. 2 is a cross-sectional view of the semiconductor memory device taken along the line A-A in FIG. 1.

FIG. 1 is a plan view showing a principal portion in a layout of a semiconductor memory device according to a first embodiment of the invention. More specifically, FIG. 1 shows a planar shape of a ferroelectric memory with a COB structure having a ferroelectric film C1, a bit line contact BLC, and a word line WL. Furthermore, FIG. 2 is a cross-sectional view of the semiconductor memory device taken along the line A-A in FIG. 1.

The schematic configuration of the ferroelectric memory according to the first embodiment will be described with reference to FIG. 2. A field effect transistor is provided on an element region AA1 in a substrate W that is a region isolated from other regions by STI (Shallow Trench Insulation). The field effect transistor includes a gate electrode that is the word line WL formed on the substrate W via a gate insulating layer, and impurity diffusion layers IDL which are formed in a surface layer of the element region AA1 in such a manner that the gate electrode is interposed between the impurity diffusion layers and which are a pair of source/drain. The bit line contact BLC is provided to connect to one of the impurity diffusion layers IDL of the source/drain, and the other of the source/drain is connected to a bit line BL1. In this manner, each one of the memory cells is connected to the bit line BL1 with the bit line contact BLC shared with a different memory cell that is adjacent to the one memory cell at one side in the row direction Dr as shown in FIG. 1.

Furthermore, a lower electrode contact LEC is formed to stand on the substrate W, and the lower electrode contact LEC is connected to the other of the impurity diffusion layers IDL of the source/drain. The other of the source/drain is connected to a lower electrode LE that is arranged above the bit line BL1. A ferroelectric film C1 is formed on the lower electrode LE in such a manner as to cover at least a part of the lower electrode LE. In addition, an upper electrode UE is formed in such a manner as to cover the ferroelectric film C1. The lower electrode contact LEC, the ferroelectric film C1, and the upper electrode UE constitute a ferroelectric capacitor FC1.

In addition, the upper electrode UE is connected to a plate electrode PL via a plate electrode contact PC.

The following is a first aspect of the ferroelectric memory according to the first embodiment. As apparent from the view of the layout in FIG. 1, only three word lines WL are arranged between the bit line contacts BLC adjacent to each other in the row direction Dr. The number of word lines WL in each of the memory cells CL1 is 1.5. Accordingly, a shape of each of the memory cells CL1 is close to a square in comparison with the related art.

More specifically, each one of the memory cells CL1 that are arranged with a predetermined pitch in the row direction Dr is arranged in such a manner as to shift only by a half of the above-mentioned predetermined pitch from another memory cell CL1 that is adjacent to the one memory cell in a column direction Dc. In this manner, the word lines WL in each of the memory cells CL1 include only a select word line and a passing word line. The select word line drives a transistor having the select word line. The passing word line passes through a boundary line LD with the memory cell CL1 that is adjacent in the row direction Dr and drives a transistor that is adjacent to the word line in the column direction Dc. Each one of the memory cells has the passing word line between the one memory cell and another memory cell that is adjacent to the one memory cell at the side opposite to the bit line contact BLC in the row direction Dr. In other words, the passing word line is formed across the boundary of two memory cells CL1 at the portion between one capacitor and another capacitor which is adjacent to the one capacitor at the side opposite to the bit line contact BLC in the row direction Dr. Accordingly, the number of the passing word lines in each of the memory cells CL1 is 0.5. As a result, the number of the word lines in each of the memory cells CL1 is 1.5.

Figure 3:
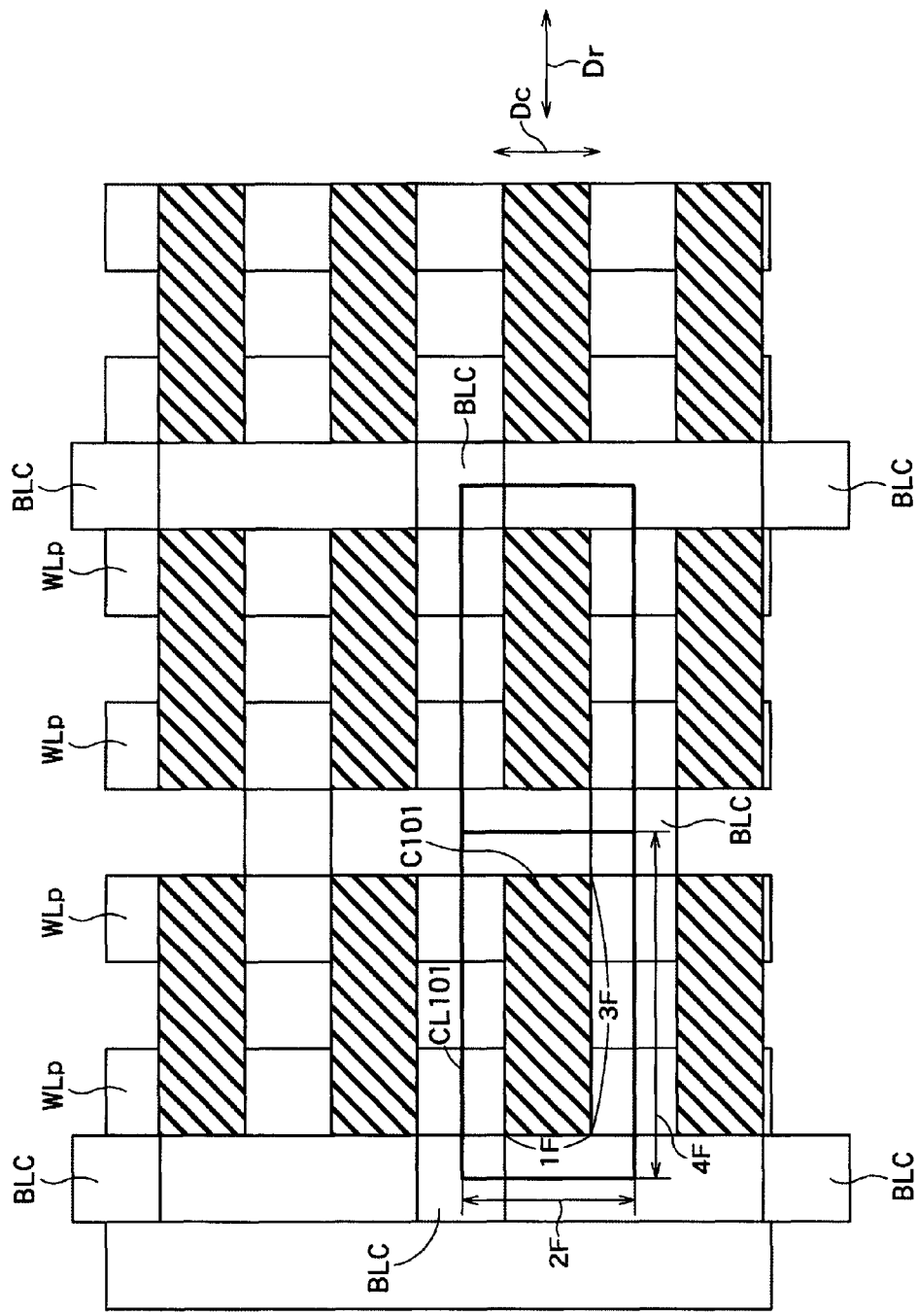
FIG. 3 is a view showing an example of a layout of a ferroelectric memory having a COB structure according to the related art.
Figure 4A:
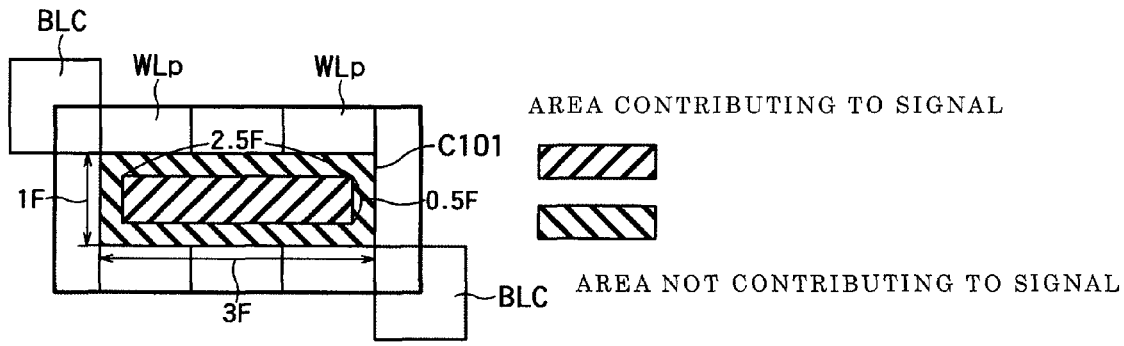
FIGS. 4A and 4C are views each showing an effective area of a capacitor in a memory cell of the ferroelectric memory shown in FIG. 1 in comparison with the related art.
Figure 4B:
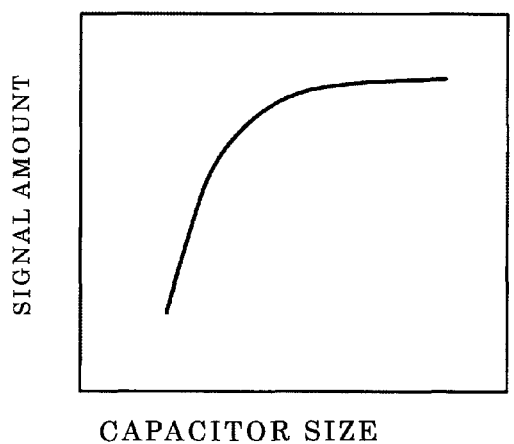
FIG. 4B is a graph showing a relationship between a capacitor size and a signal amount.

FIG. 3 shows an example of a layout of a ferroelectric memory having a COB structure according to the related art as a comparative example. In FIG. 3, a memory cell CL101 will be described, for example. Two word lines WLp pass through the memory cell CL101. The size of the memory cell CL101 is 4 F in the long axis direction (row direction Dr) and 2 F in the short axis direction (column direction Dc), and the area of the memory cell CL101 is 8 $F^2$. The size of a ferroelectric film C101 is 3 F×1 F, and the area of the ferroelectric film C101 is 3 $F^2$. As described above, it is assumed that a region extending by (¼)F from each edge does not contribute to a signal due to characteristic degradation in the manufacturing process. As shown in FIG. 4A, an area having a signal in the capacitor area is 2.5 F×0.5 F=1.25 $F^2$. FIG. 4B is a graph showing a relationship between the capacitor size and the signal amount. It is also understood from the graph that the longer perimeter length of the capacitor causes the more characteristic degradation of the dielectric film.

Figure 4C:
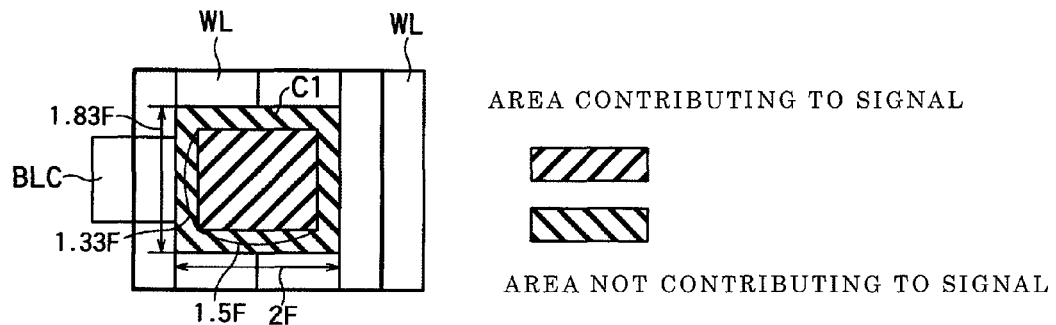

On the other hand, as shown in FIG. 1, the size of a memory cell C1 of the ferroelectric memory according to the embodiment is 3 F×2.83 F (=8.5 $F^2$), and the memory cell C1 is closer to a square. The size of the capacitor is 2 F×1.83 F=3.66 $F^2$ as shown in FIG. 4C, and the capacitor area contributing to a signal is 1.5 F×1.33 F=2 $F^2$. Accordingly, if the same cell area as the related art is assumed, the capacitor area contributing to a signal is 2 $F^2$/1.25 $F^2$×8 $F^2$/8.5 $F^2$=1.51. It is understood that, in the embodiment, the capacitor area contributing to a signal is not less than 51% larger than that in the conventional example. Accordingly, with the embodiment, the signal amount can be increased by 51% with the approximately same memory cell size as the conventional memory cell size.

Figure 5:
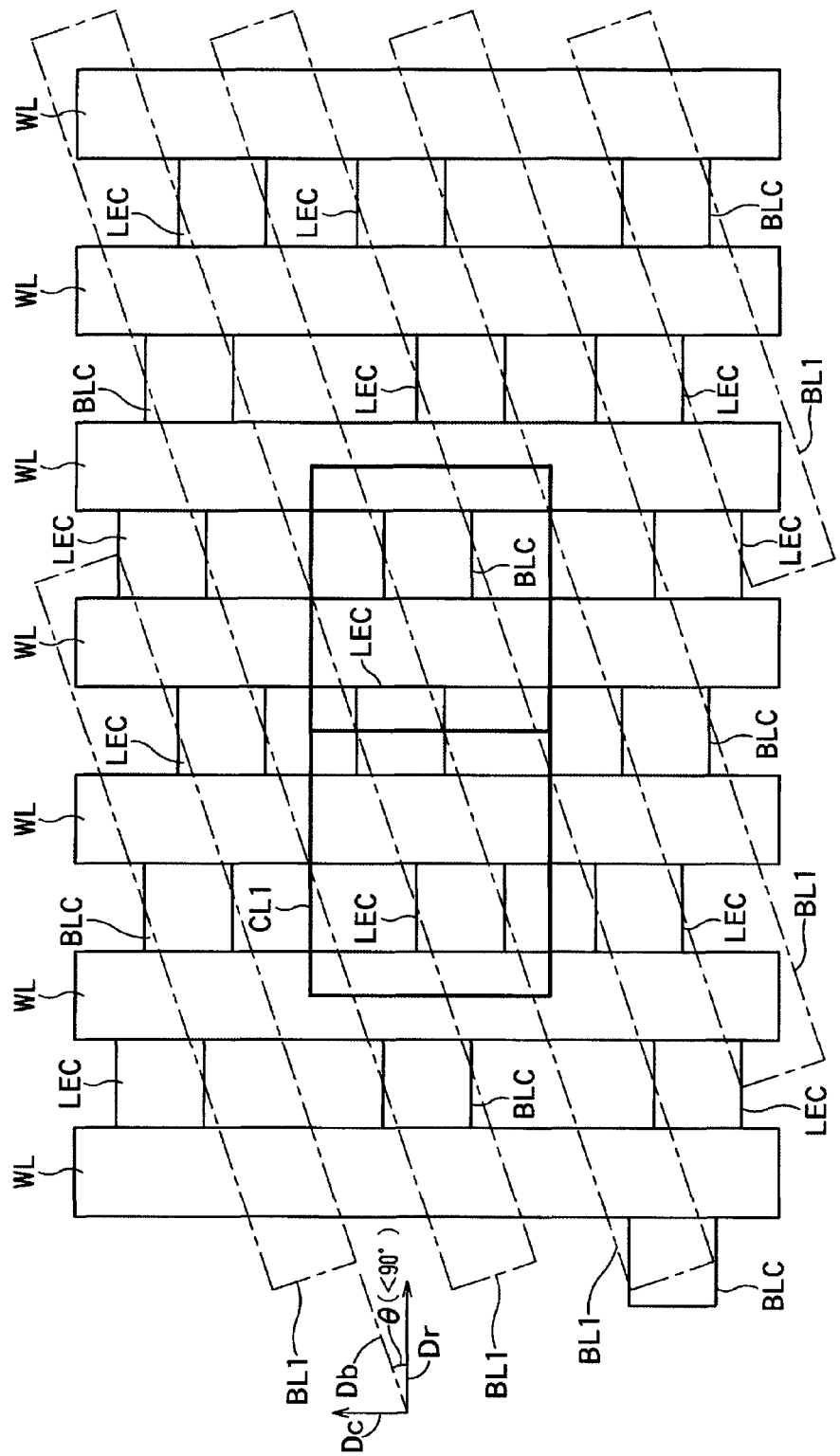
FIG. 5 is a plan view showing a structure from bit lines to word lines in the layout of the ferroelectric memory shown in FIG. 1.
Figure 6:
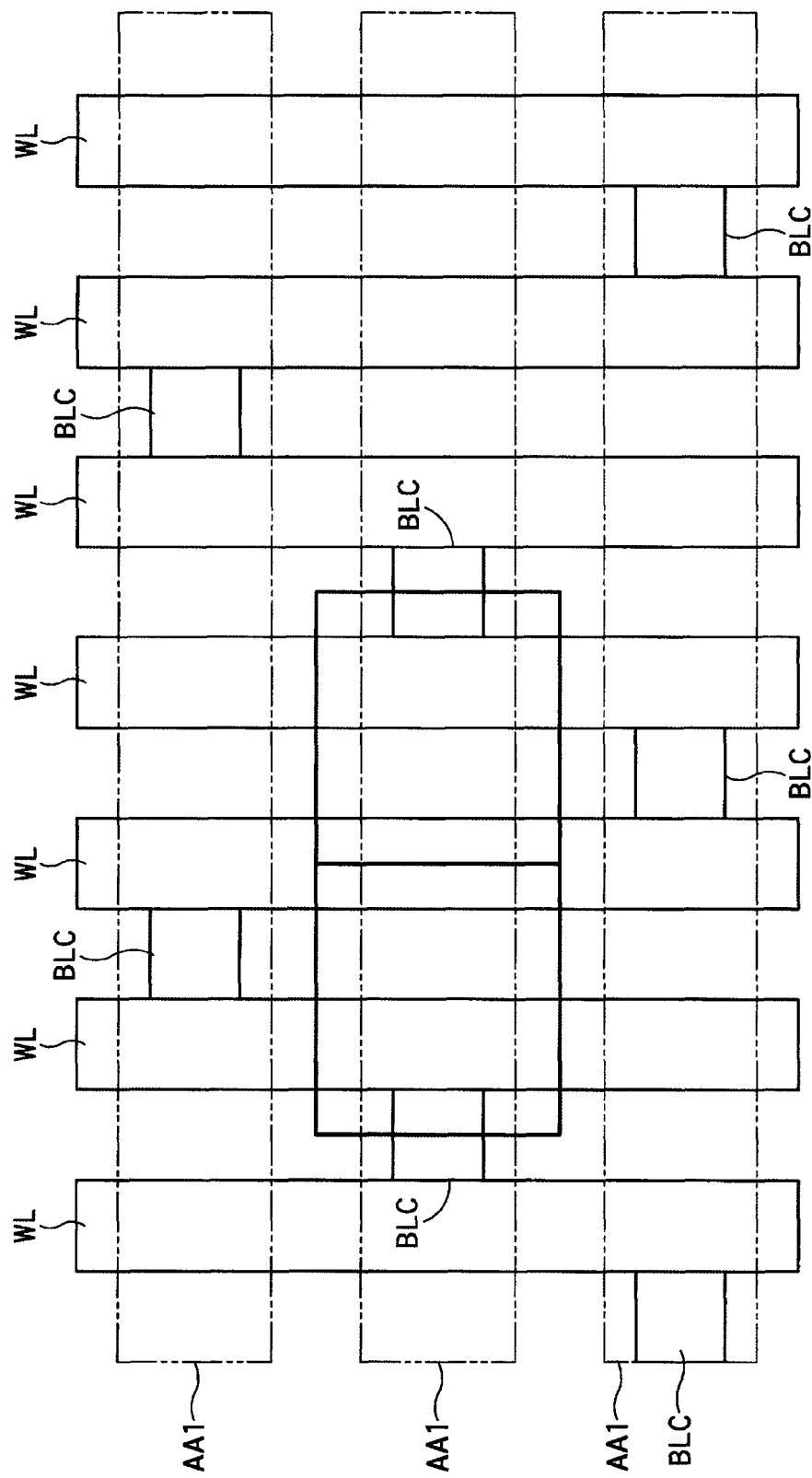
FIG. 6 is a plan view showing a positional relationship among an element region, a bit line contact, and the word line in the ferroelectric memory shown in FIG. 1.

FIG. 5 is a plane view showing a structure including the bit lines BL1 and the word lines WL in the layout of the ferroelectric memory according to the first embodiment. FIG. 6 is a plane view showing a positional relationship among the element regions AA1, the bit line contacts BLC, and the word lines WL. As shown in FIG. 5, a second aspect of the first embodiment is that the bit lines BL1 are obliquely arranged to the row direction Dr of the memory cell CL1. More specifically, a direction Db of the bit line BL1 has an acute angle θ (<90°) with the row direction Dr of the memory cell CL1. With the arrangement, a short axis of the unit memory cell CL1 is defined with the pitch of the oblique bit line BL1, so that a shape of the memory cell CL1 as well as a shape of the capacitor can be further closer to a square. Accordingly, the shorter perimeter length of the capacitor allows the reduction of the edge region that receives the signal degradation due to the capacitor forming process. As a result, a capacitor region that does not receive the signal degradation increases in comparison with the conventional example, so that the signal amount can be increased. Furthermore, in spite of the small number of the word lines WL in comparison with the conventional example, a folded arrangement can be achieved in relation with a sense amplifier (not shown).

Next, a manufacturing method of the ferroelectric memory according to the first embodiment will be described with reference to FIGS. 7A to 10. FIGS. 7A to 10 are cross-sectional views along the section line corresponding to the line A-A in FIG. 1 in each of the manufacturing processes.

First, a select transistor is formed on a substrate by using a conventional transistor manufacturing process. Specifically, as shown in FIG. 7A, a shallow trench ST is formed in an element isolation region after an active region on the surface of the semiconductor substrate W is covered with a silicon nitride film, and a silicon oxide film is deposited on the entire surface, for example.

Subsequently, the silicon oxide film is left in the trench for the element isolation by chemical mechanical polishing (CMP). The element isolation is completed by removing the silicon nitride film in the active region.

Next, after the silicon oxide film is formed on the entire surface by thermal oxidation, a polycrystalline silicon film and a silicon nitride film are deposited in order on the entire surface. The word line WL is formed by selectively removing the polycrystalline silicon film and the silicon nitride film by photolithography and reactive ion etching (RIE) as shown in FIG. 7B.

As shown in FIG. 8A, phosphorus ions are implanted into the memory cell region and then thermal annealing is performed, so that the n-type impurity diffusion layers IDL are formed to be a source and a drain of the transistor.

After the silicon nitride film is deposited on the entire surface, a silicon nitride film SW is left on the sidewall of the word line WL by RIE as shown in FIG. 8A. The silicon nitride film SW which is left on the side surface of the word line acts as an insulating layer in a process described later, when the bit line contact BLC and the lower electrode contact LEC are formed using a self-alignment process with respect to the word line WL.

After the silicon oxide film is deposited on the entire surface, the entire surface is planarized by CMP. As shown in FIG. 8B, a contact CH1 is opened in a region to be the bit line contact BLC by photolithography and RIE. Subsequently, a tungsten (W) film is deposited on the entire surface and is left in the contact CH1 by removing the flat portion by CMP. After a W film is deposited on the entire surface again, the bit line BL1 is formed by photolithography and RIE as shown in FIG. 8B.

Figure 9:
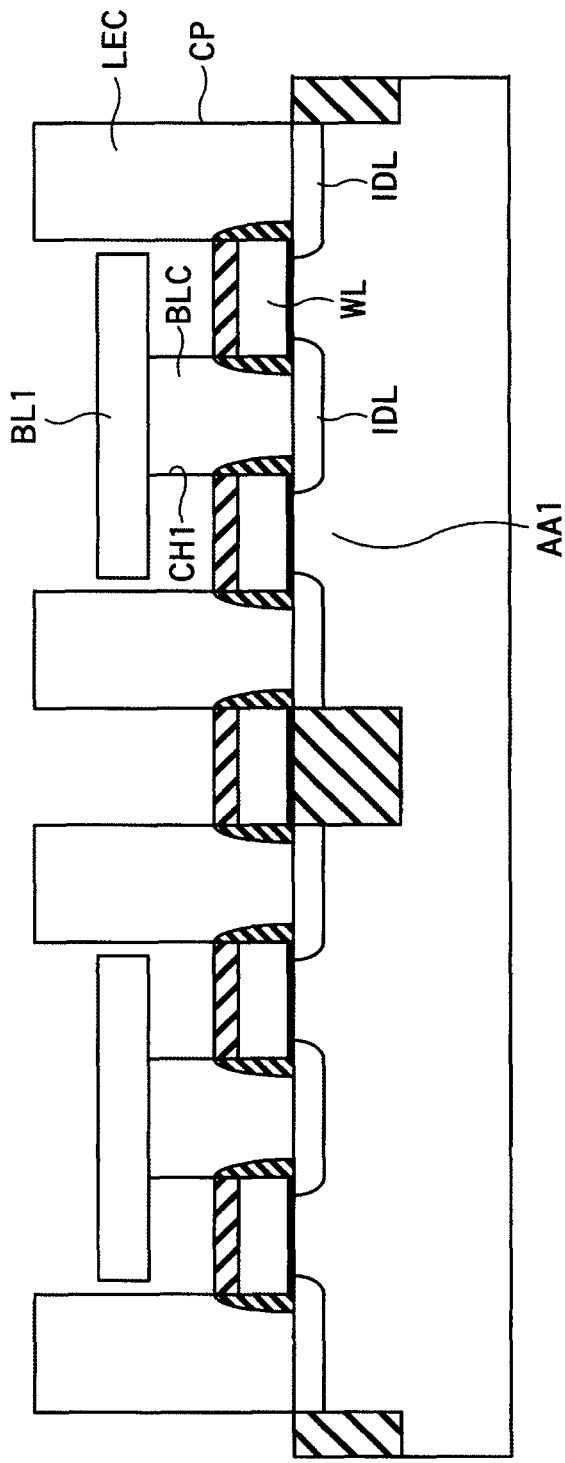
FIG. 9 is a cross-sectional view explaining the manufacturing method of the ferroelectric memory shown in FIG. 1.

After the silicon oxide film is deposited on the entire surface, the entire surface is planarized by CMP, so that an interlayer film is formed between the bit line BL1 and the capacitor (see a reference numeral FC1 in FIG. 2). Subsequently, a contact CP is opened between the impurity diffusion layer IDL and the lower electrode (see a reference numeral LE in FIG. 2) by photolithography and RIE as shown in FIG. 9.

A W film is deposited on the entire surface and the entire surface is planarized by CMP, so that the W film is left in the contact CP. Accordingly, a contact LEC connecting with the lower electrode is formed as shown in FIG. 9.

After a material (Ir, for example) of the lower electrode LE is deposited on the entire surface, a ferroelectric film (PZT (Lead Zirconate Titanate) or SBT (Strontium Bismuth Tantalate), for example) is deposited on the entire surface, and materials (Pt, Ir, and $IrO_2$, for example) of the upper electrode are further deposited on the entire surface.

Figure 10:
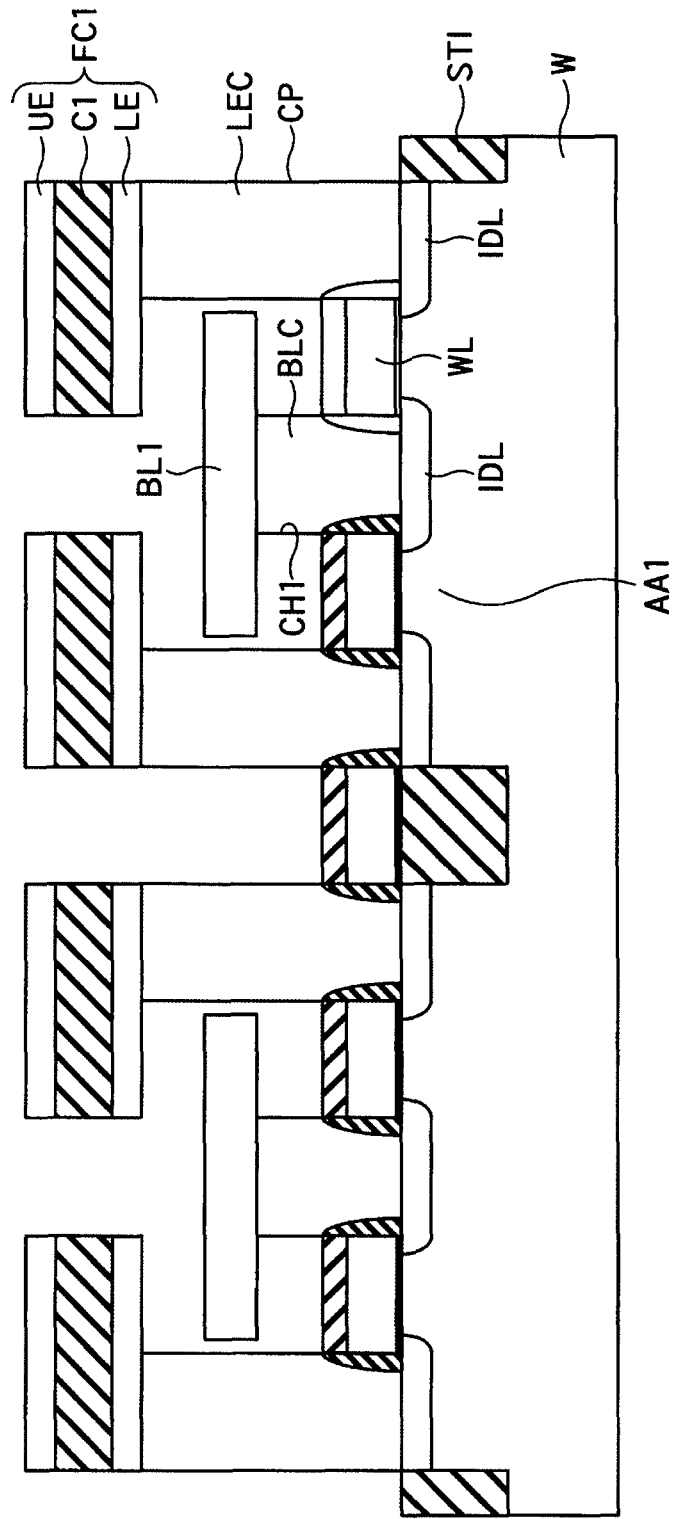
FIG. 10 is a cross-sectional view explaining the manufacturing method of the ferroelectric memory shown in FIG. 1.

In order to form the capacitor, an $Al_2O_3$ film is etched by photolithography and RIE after $Al_2O_3$ is deposited on the entire surface, and the upper electrode, the ferroelectric film, and the lower electrode are further formed, for example. Accordingly, the ferroelectric capacitor FC1 formed of the lower electrode LE, the ferroelectric film C1, and the upper electrode UE is completed as shown in FIG. 10.

After the silicon oxide film is deposited on the entire surface, the entire surface is planarized by the CMP, so that an interlayer dielectric between the ferroelectric capacitor and a plate wiring is formed. Subsequently, an opening is provided in the interlayer dielectric by photolithography and RIE, so that a plate contact (see a reference numeral PC in FIG. 2) is formed. Subsequently, a W film is deposited on the entire surface and the entire surface is planarized by the CMP, so that the W is embedded in the plate contact. In addition, an aluminum (Al) film is deposited on the entire surface and is etched by photolithography and RIE, so that a plate line (see a reference numeral PL in FIG. 2) is formed. Accordingly, the ferroelectric memory is provided as shown in FIG. 2.

Second Embodiment

Figure 11:
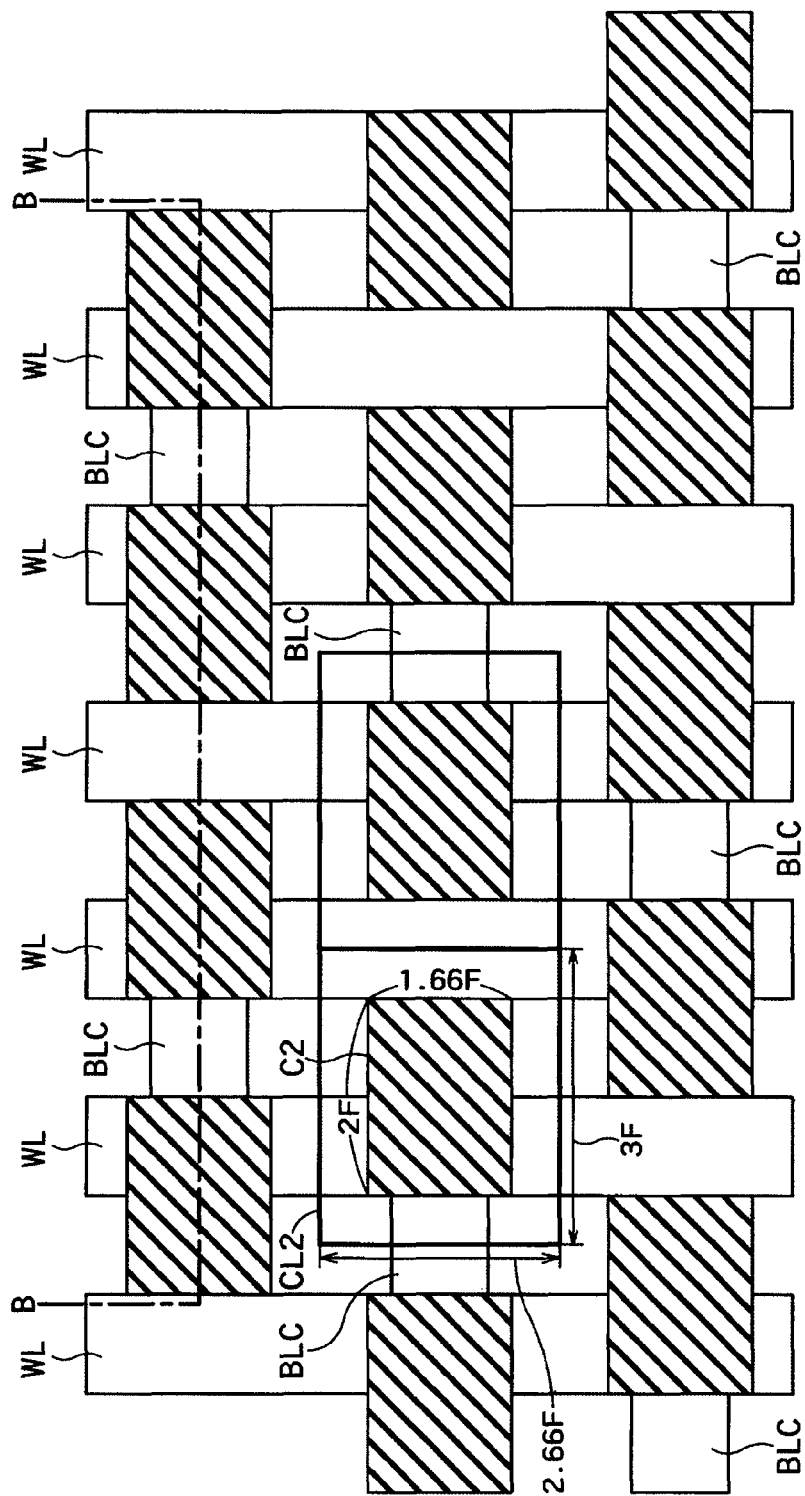
FIG. 11 is a plan view showing a principal portion in a layout of a semiconductor memory device according to a second embodiment of the invention.
Figure 12:
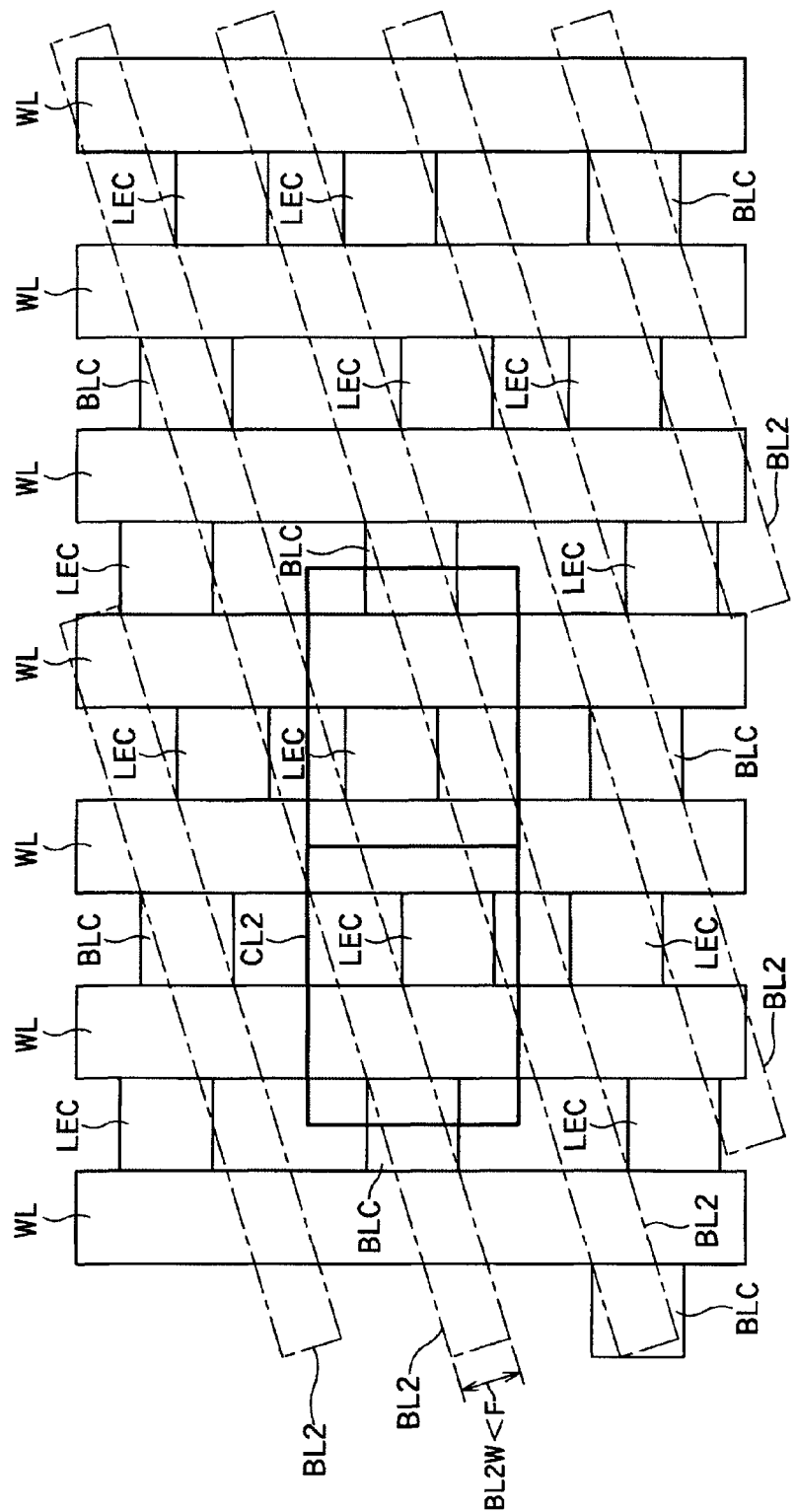
FIG. 12 is a plan view showing a structure from bit lines to word lines in the layout of the ferroelectric memory shown in FIG. 11.
Figure 13:
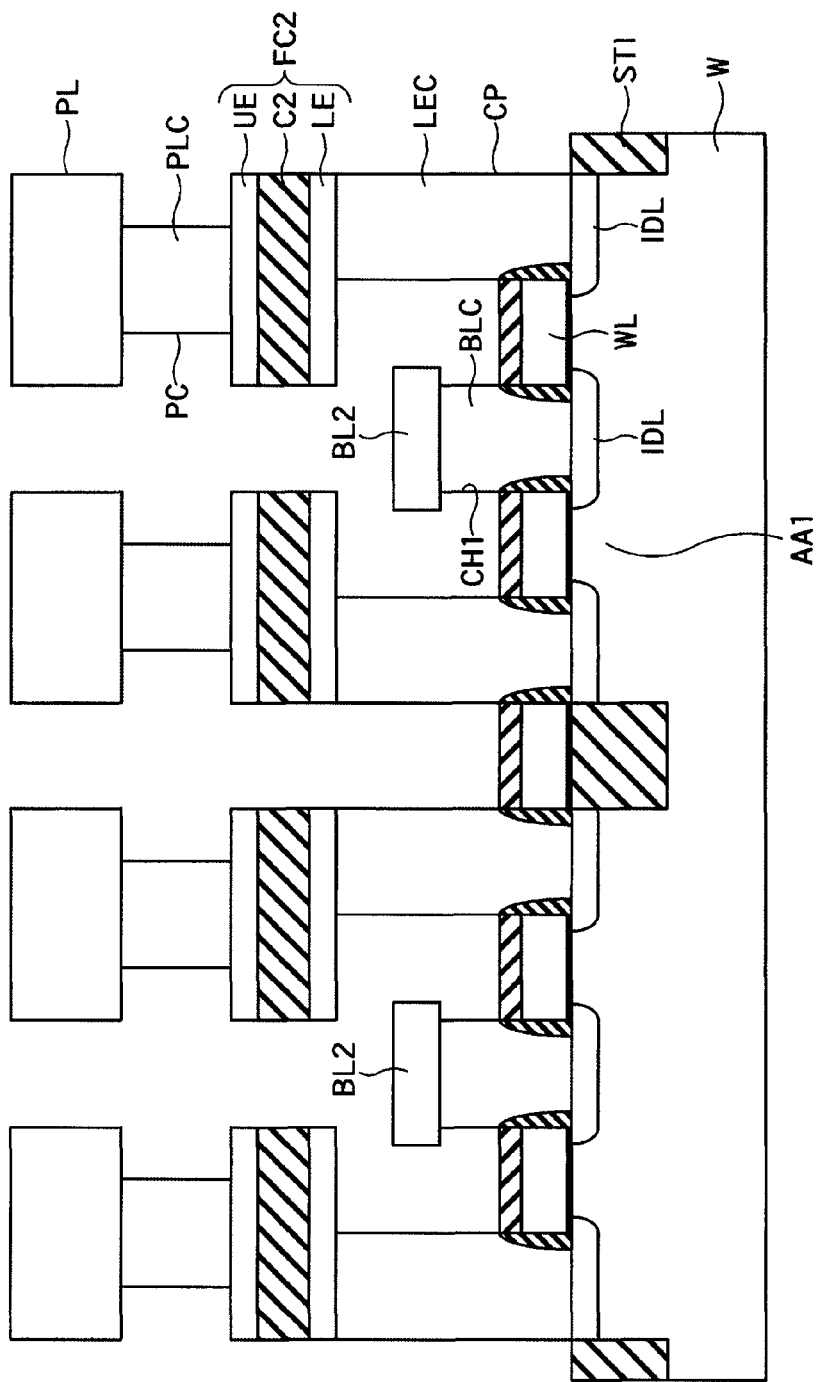
FIG. 13 is a cross-sectional view of the ferroelectric memory taken along the line B-B in FIG. 11.

FIGS. 11 and 12 are plane views each showing a principal portion in a layout of a semiconductor memory device according to a second embodiment of the invention. FIG. 11 shows ferroelectric lines C2, bit line contacts BLC, and word lines WL, and FIG. 12 is a plan view showing a structure including bit lines BL2 and the word lines WL. In addition, FIG. 13 is a cross-sectional view of the semiconductor memory device according to the second embodiment taken along the line B-B in FIGS. 11 and 12. As shown in FIG. 13, a lower electrode LE, the ferroelectric line C2, and an upper electrode UE constitute a ferroelectric capacitor FC2 in the second embodiment.

The short side length of the unit memory cell is 2.83 F in the first embodiment described above, while the length of the short side of the unit memory cell is 2.66 F in the second embodiment as shown in FIG. 11. Accordingly, although the size of a cell is approximately the same as that in the conventional example, the effective area of a capacitor can be expanded. In the second embodiment, the effective area of a capacitor is 1.16 F×1.5 F=1.74 $F^2$. Therefore, the signal amount is expected to increase by 39% in comparison with the conventional example.

As described above, since the width of the bit line BL2 is less than a minimum processing dimension F as shown in FIG. 12, the length of the short side of a unit cell in the second embodiment is reduced in comparison with the first embodiment. This is also apparent when comparing the width of the bit line BL2 in FIG. 13 to the width of the bit line BL1 which is a line and space pattern in accordance with the minimum processing dimension as shown in FIG. 2. Note that, the length of the short side of the unit memory cell is 1.66 F in the example shown in FIG. 11. However, as will be described later, the length of the short side of the unit memory cell can be less than 1.66 F.

A manufacturing method of the ferroelectric memory shown in FIGS. 11 to 13 will be described with reference to FIGS. 14 to 17 as an embodiment of the manufacturing method of the semiconductor memory device according to the second embodiment.

First, a select transistor is formed on a substrate W by using a conventional transistor manufacturing process. The manufacturing steps of the select transistor are the same as those in the first embodiment described above, and the views of the manufacturing steps are substantially identical with FIGS. 7 and 8A, and are omitted.

Figure 14:
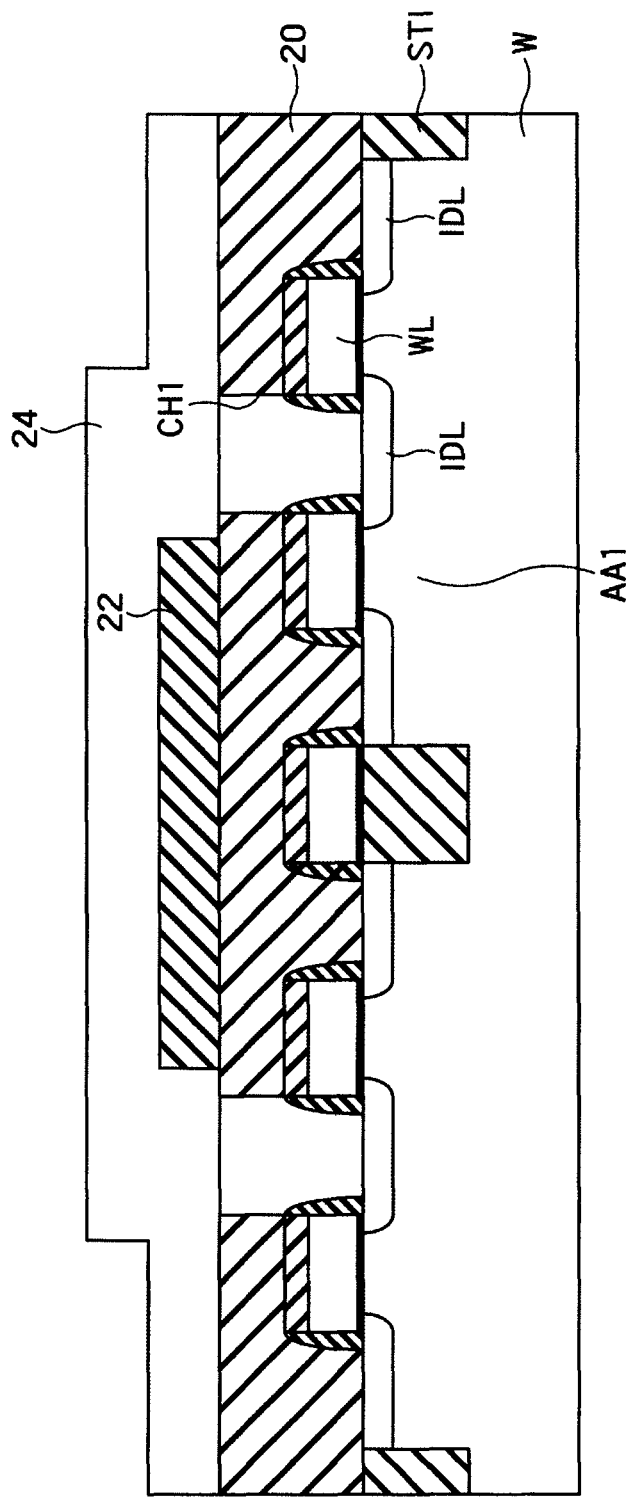
FIG. 14 is a cross-sectional view explaining a manufacturing method of the ferroelectric memory shown in FIG. 11.
Figure 15:
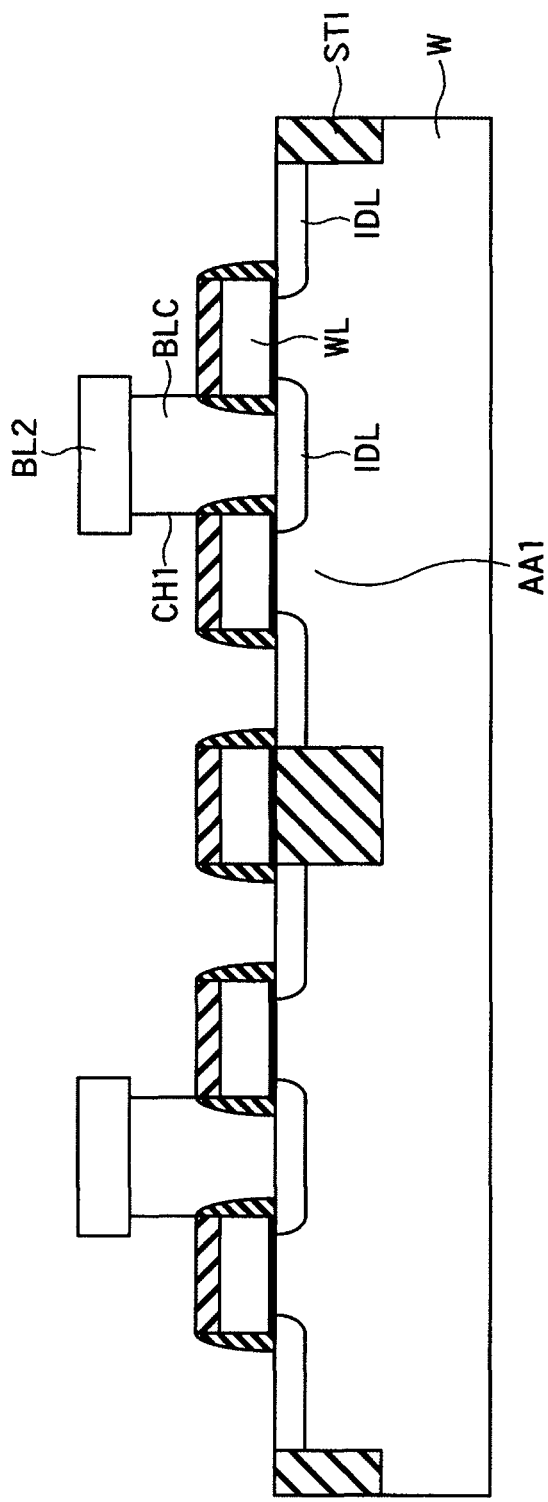
FIG. 15 is a cross-sectional view explaining the manufacturing method of the ferroelectric memory shown in FIG. 11.

A feature of the second embodiment is a process for forming a bit line shown in FIGS. 14 and 15. First, after a tetra ethoxy silane (TEOS) film 20 is deposited on the entire surface as an interlayer dielectric film and is planarized by the CMP. Subsequently, a contact CH1 is opened in a region to be the bit line contact BLC by photolithography and RIE. After a W film is deposited on the entire surface, the flat portion is removed by CMP. In this manner, the W film is left in the contact CH1. In the second embodiment, the W film corresponds to a first conductive material, for example.

Subsequently, a sacrificial film having a size depending on a desired interval between the adjacent bit lines BL2 is formed. Specifically, a boron-silicate glass (BSG) layer is deposited on the entire surface. Next, the BSG layer is etched with a pitch twice of that of the bit lines BL2, so that a BSG film 22 is formed. The film thickness of the BSG film 22 corresponds to the film thickness of the bit line BL2, and is set to be 100 nm, for example. Subsequently, a tungsten (w) film is deposited at 100 nm, for example, to form a metal film 24. In the embodiment, the W film corresponds to a second conductive material, for example. Note that, the film thickness of the BSG film 22 is further thinned and both ends of the BSG film 22 are brought closer to a bit line contact CH1, so that the width of the bit line can be further reduced.

Next, as shown in FIG. 15, the metal film 24 is left on the sidewalls of the BSG film 22 by RIE which removes the entire surface to form a bit line. Subsequently, the BSG film is selectively removed with HF steam to complete the bit line BL2. Using the HF steam allows removal of only the BSG without removing the TEOS (not shown) which is an interlayer dielectric. The bit line having a size less than the minimum processing dimension defined by photolithographic technique can be formed by using the method according to the second embodiment. Accordingly, the short side of a unit memory cell can be reduced.

Figure 16:
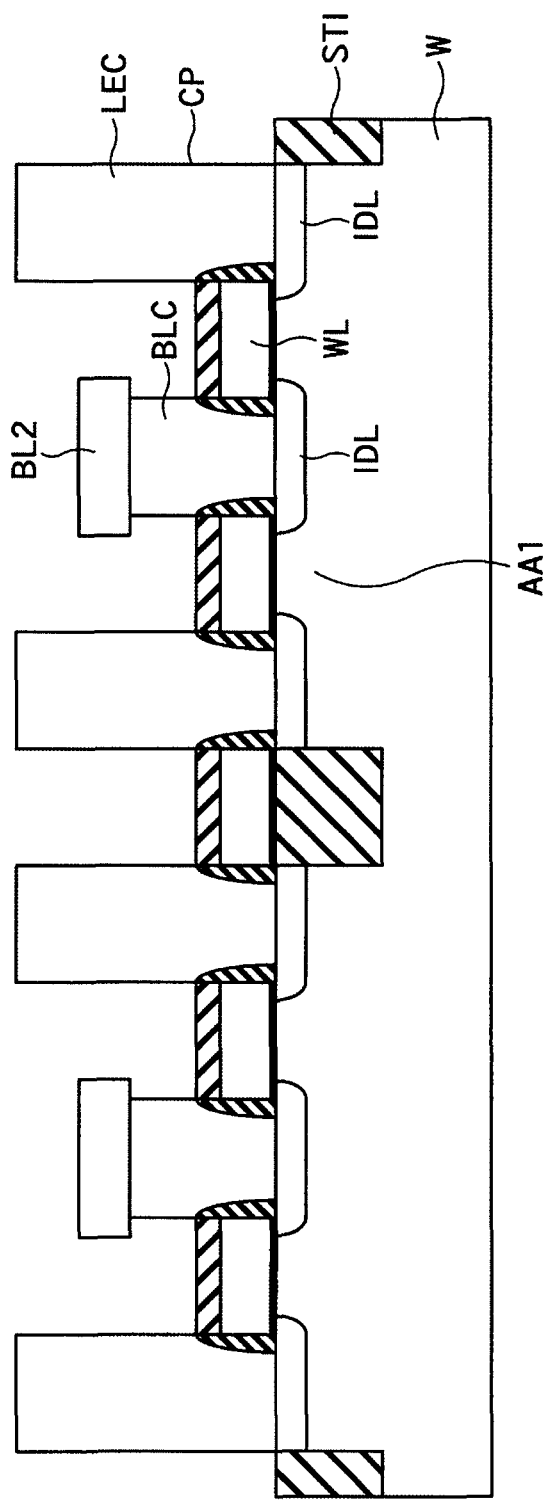
FIG. 16 is a cross-sectional view explaining the manufacturing method of the ferroelectric memory shown in FIG. 11.
Figure 17:
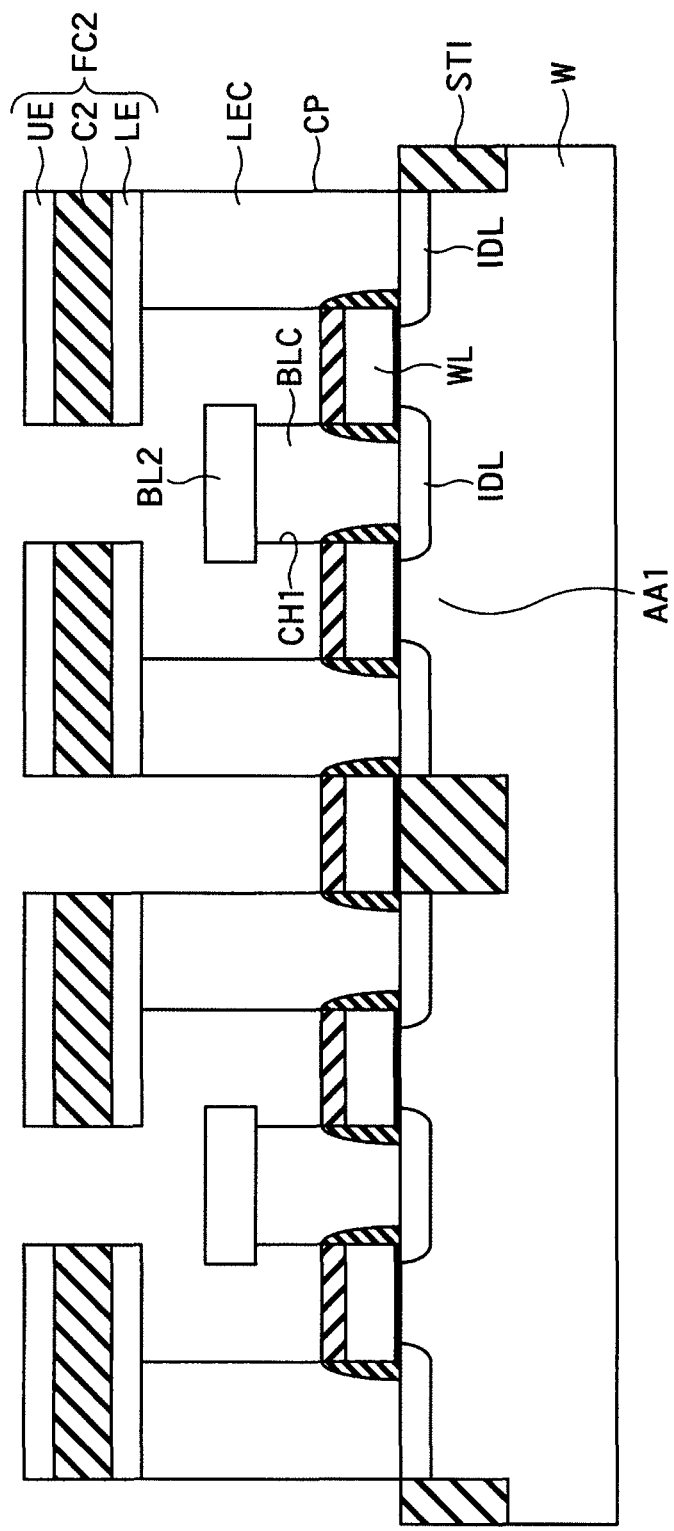
FIG. 17 is a cross-sectional view explaining the manufacturing method of the ferroelectric memory shown in FIG. 11.

After processing steps mentioned above, the ferroelectric memory as shown in FIG. 13 is provided by the processes which are the same as those in the first embodiment as shown in FIGS. 16 and 17.

Third Embodiment

Figure 18:
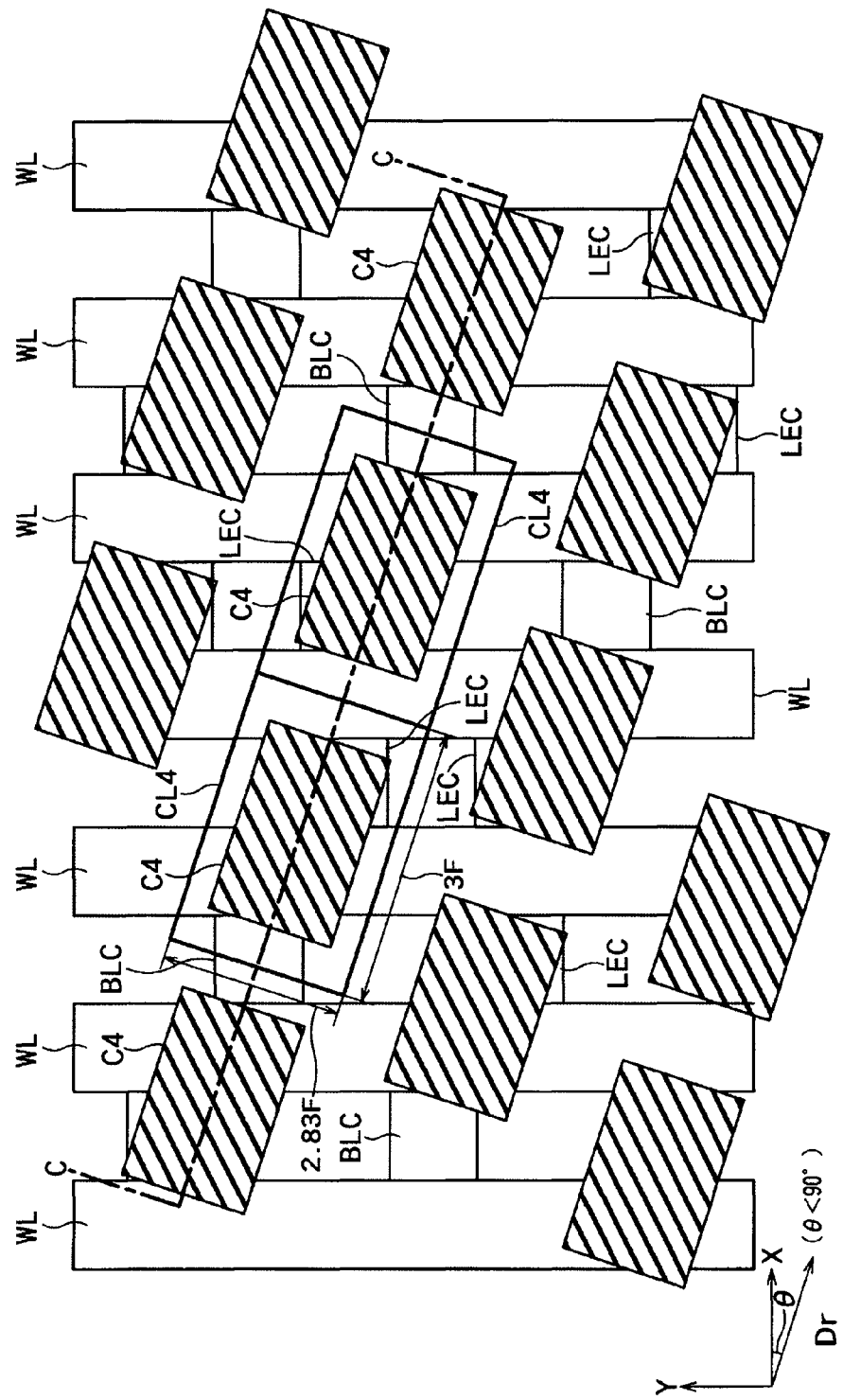
FIG. 18 is a plan view showing a principal portion in a layout of a semiconductor memory device according to a third embodiment of the invention.
Figure 19:
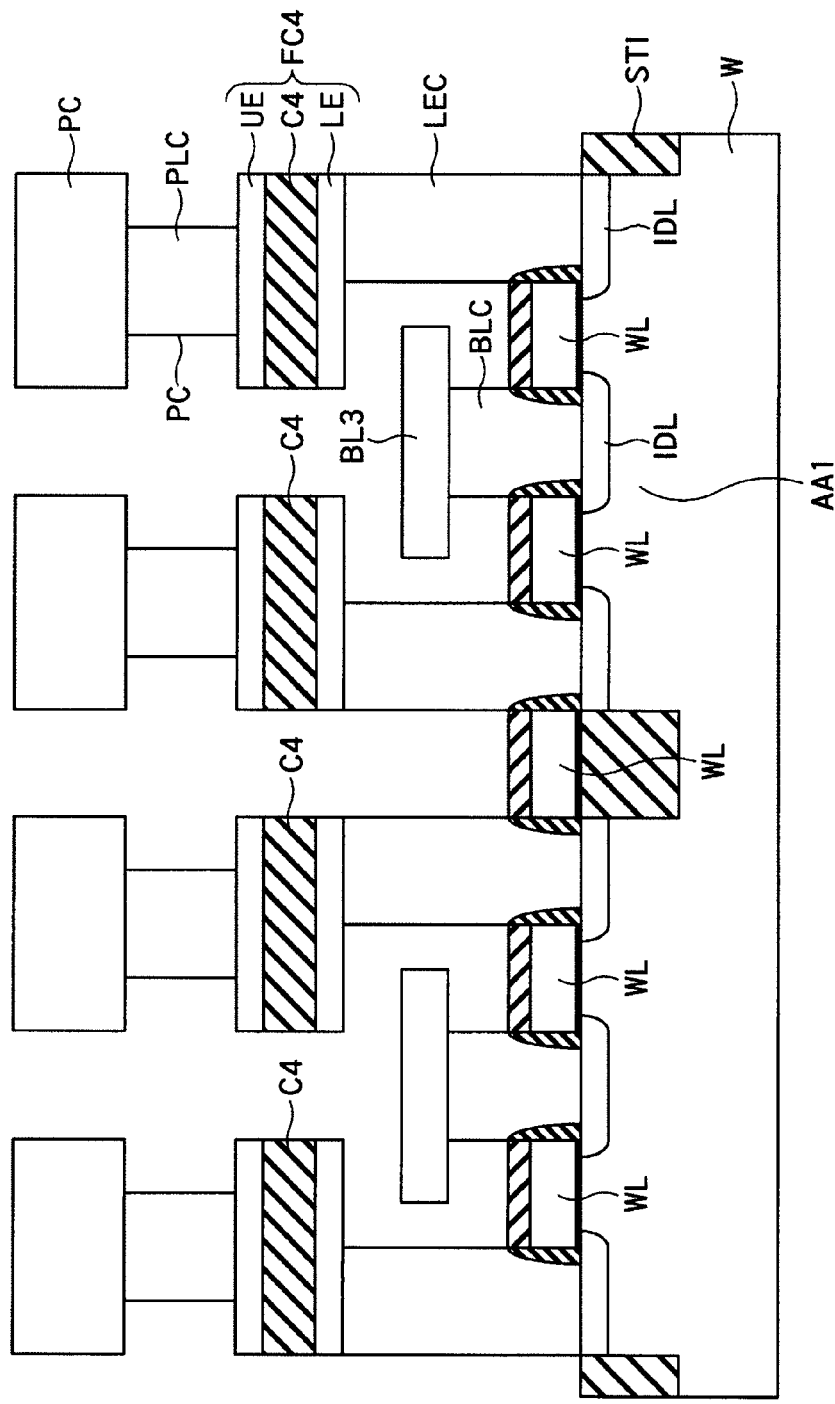
FIG. 19 is a cross-sectional view of the semiconductor memory device taken along the line C-C in FIG. 18.

FIG. 18 is a plane view showing a layout of a ferroelectric film C4, a bit line contact BLC, and a word line WL in a principal portion of a semiconductor memory device according to a third embodiment of the invention. FIG. 19 is a cross-sectional view of the semiconductor memory device according to the embodiment taken along the line C-C in FIG. 18. As shown in FIG. 19, a lower electrode LE, the ferroelectric film C4, and an upper electrode UE constitutes a ferroelectric capacitor FC4 in the third embodiment.

As apparent in comparison with FIG. 1, a feature of a ferroelectric memory according to the third embodiment in which unit memory cells CL4 are obliquely arranged, and the row direction Dr of the memory cells is arranged to form an acute angle θ with the X direction where a direction of a word line is set to be a X direction and a direction perpendicular to the X direction is set to be a Y direction. The length of the long side is 3 F and the length of the short side is 2.83 F in the memory cell CL4 according to the third embodiment.

Figures 20A, 20B:
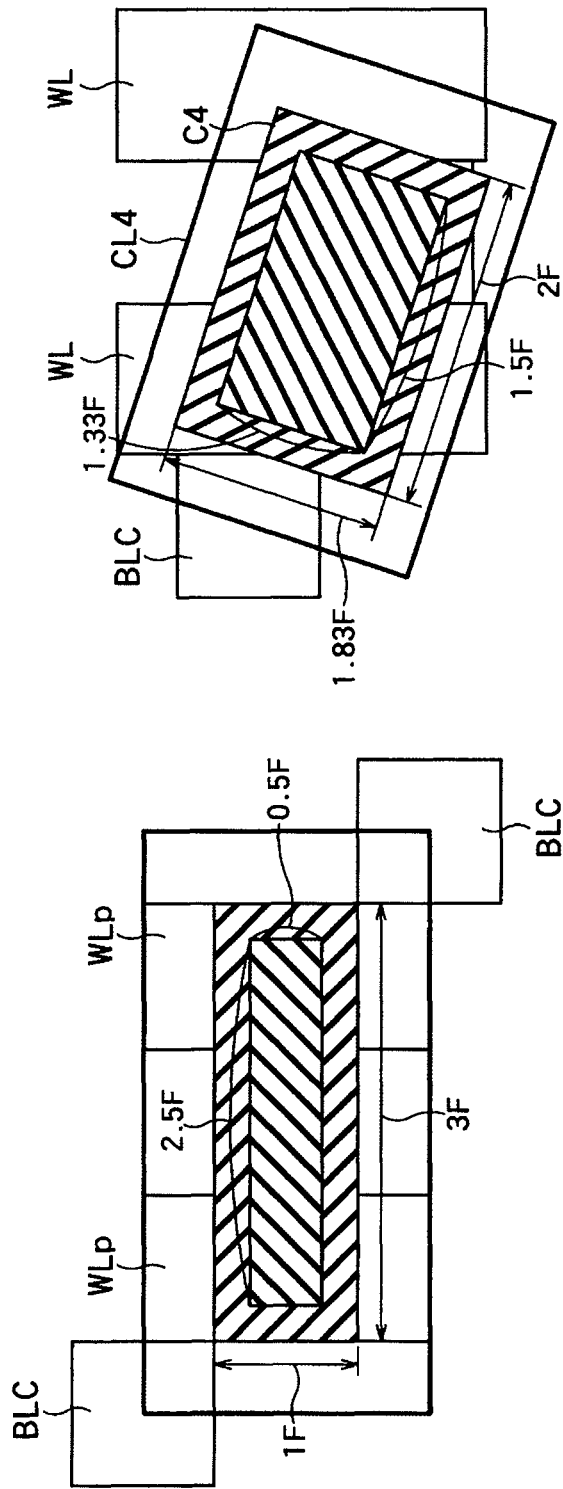
FIGS. 20A and 20B are views each showing an effective area of a capacitor in a memory cell of a ferroelectric memory shown in FIG. 18 in comparison with the related art.

FIGS. 20A and 20B are views showing the effective area of the ferroelectric film C4 in the memory cell CL4 of the ferroelectric memory according to the third embodiment in comparison with the related art. As shown in FIG. 20B, the length of the long side is 2 F and the length of the short side is 1.83 F in the ferroelectric film C4 according to the third embodiment. Accordingly, the capacitor area of the ferroelectric film C4 is 3.66 $F^2$. The capacitor area is expanded by 22% in comparison with the capacitor area in the related art as shown in FIG. 20A. In addition, if it is assumed that a region extending by (¼)F from each edge does not contribute to a signal due to characteristic degradation which is caused in the manufacturing process, an area having a signal is 2.0 $F^2$ in the capacitor area of 3.66 $F^2$. The area having a signal is increased by 60% in comparison with 1.25 $F^2$ in the related art. Accordingly, with the third embodiment, it is possible to increase the signal amount by 60% even with the approximately same cell size as the conventional example.

Figure 21:
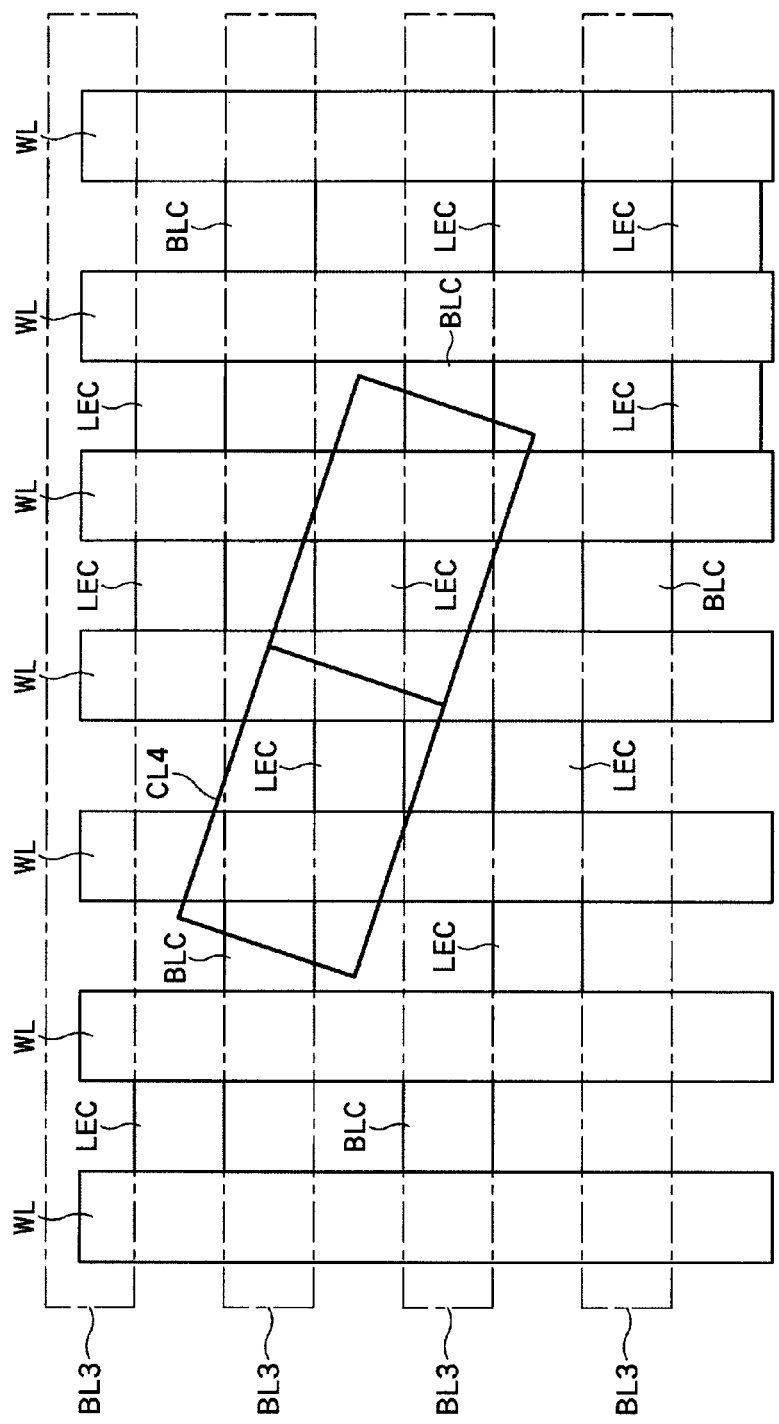
FIG. 21 is a view showing a layout of a word line, a bit line, and a contact between a impurity diffusion layer and a lower electrode in the ferroelectric memory shown in FIG. 18.
Figure 22:
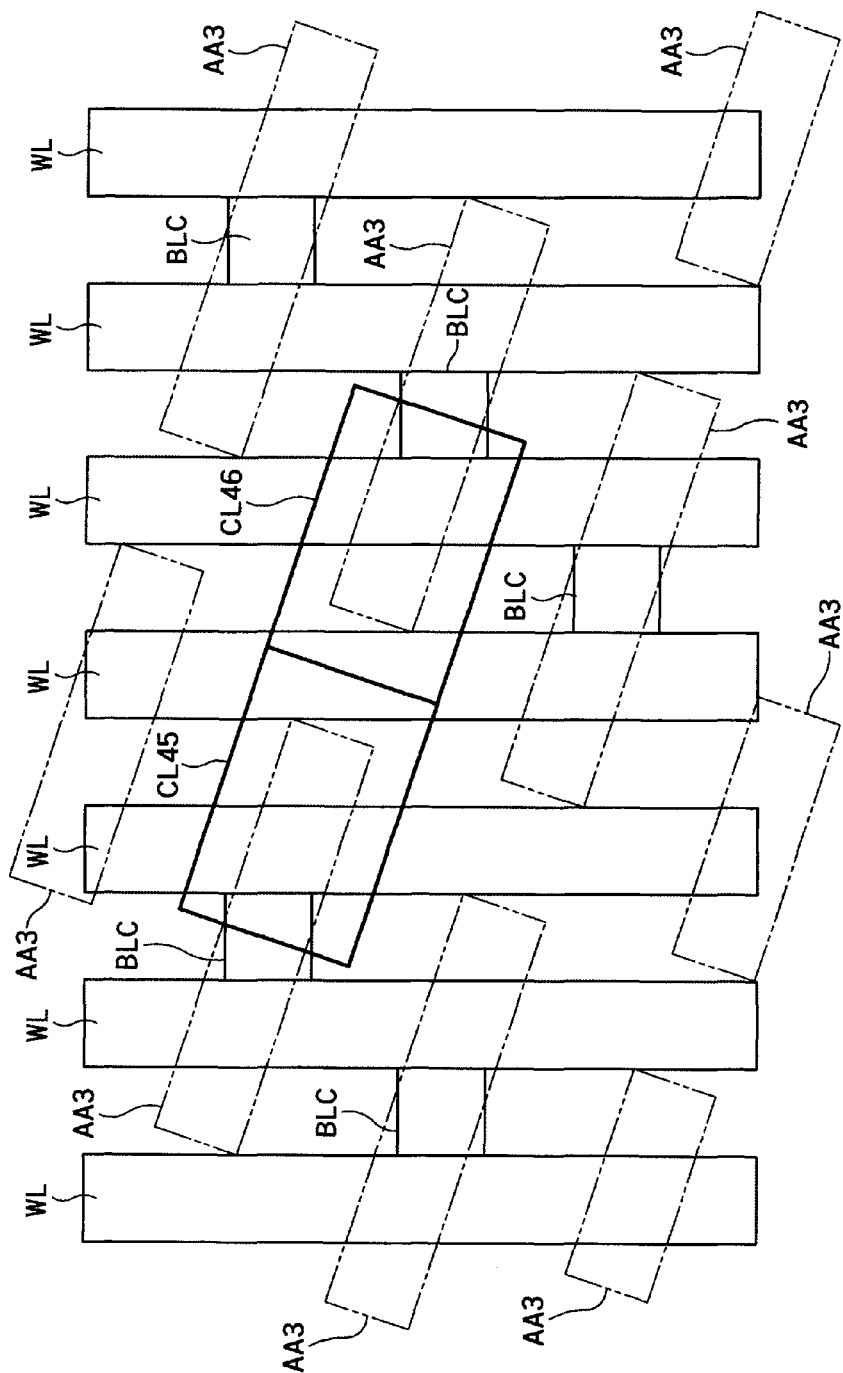
FIG. 22 is a view showing a layout of a bit line contact, the word line, and an element region in the ferroelectric memory shown in FIG. 18.

FIG. 21 shows a layout of the word line WL, the bit line BL3, the contact (LEC) between an impurity diffusion layer IDL and the lower electrode LE in the ferroelectric memory according to the third embodiment. Furthermore, FIG. 22 shows a layout of the bit line contact BLC, the word line WL, and an element region AA3.

A manufacturing method of the ferroelectric memory according to the third embodiment is substantially identical with the first embodiment, except that the ferroelectric capacitor and the element region AA3 are obliquely formed to the direction perpendicular to the word line WL. Accordingly, the detailed explanation is omitted.

Fourth Embodiment

In the third embodiment described above, both of the element forming area and the ferroelectric capacitor area are obliquely arranged to the direction perpendicular to the word line WL. However, the arrangement is not limited to the arrangement according to the third embodiment, only the element forming region may be obliquely arranged, and the ferroelectric capacitor may be arranged in the direction perpendicular to the word line.

Figure 23:
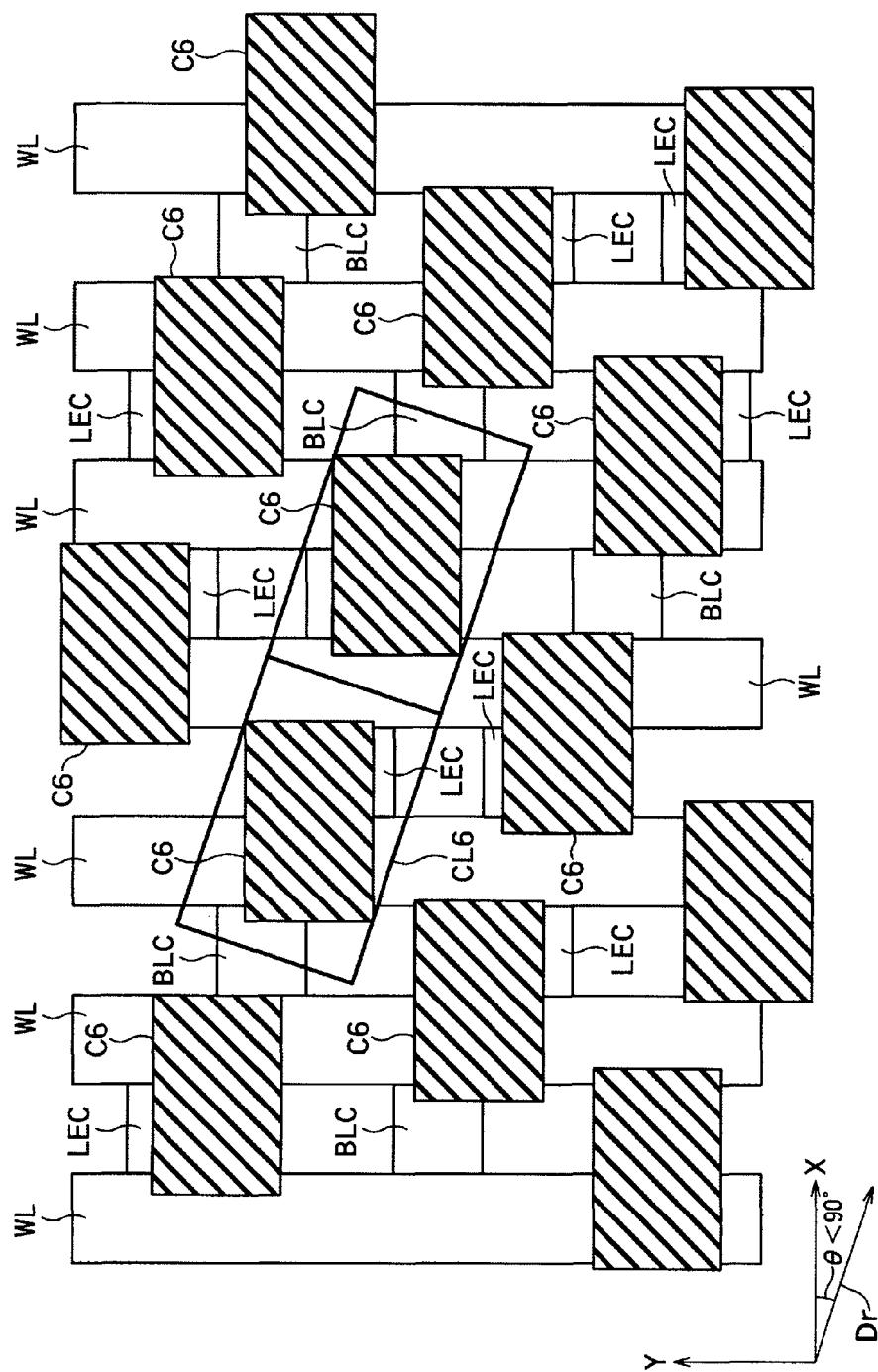
FIG. 23 is a plan view showing a principal portion in a layout of a semiconductor memory device according to a fourth embodiment of the invention.

FIG. 23 is a plane view showing a principal portion in a layout of a semiconductor memory device according to a fourth embodiment of the invention. As shown in FIG. 23, a ferroelectric memory according to the fourth embodiment, a memory cell CL6 is arranged to extend obliquely in such a manner that the row direction Dr of the memory cell CL6 forms an acute angle θ to the X direction. However, the long side of a ferroelectric capacitor including a ferroelectric film C6 is parallel to the X direction, and the ferroelectric capacitor is arranged to be perpendicular to the word line WL.

With the fourth embodiment, the arrangement direction of the ferroelectric capacitors is the same as the conventional arrangement direction. Accordingly, the manufacturing steps such as tests or the like during the manufacturing process and etching by photolithography and RIE become easy in comparison with the third embodiment. Meanwhile, the planar shape and the size of the ferroelectric film C6 are substantially identical to the third embodiment. Accordingly, with the fourth embodiment, it is possible to increase the signal amount by 60% in comparison with the conventional example.

Fifth Embodiment

Figure 24:
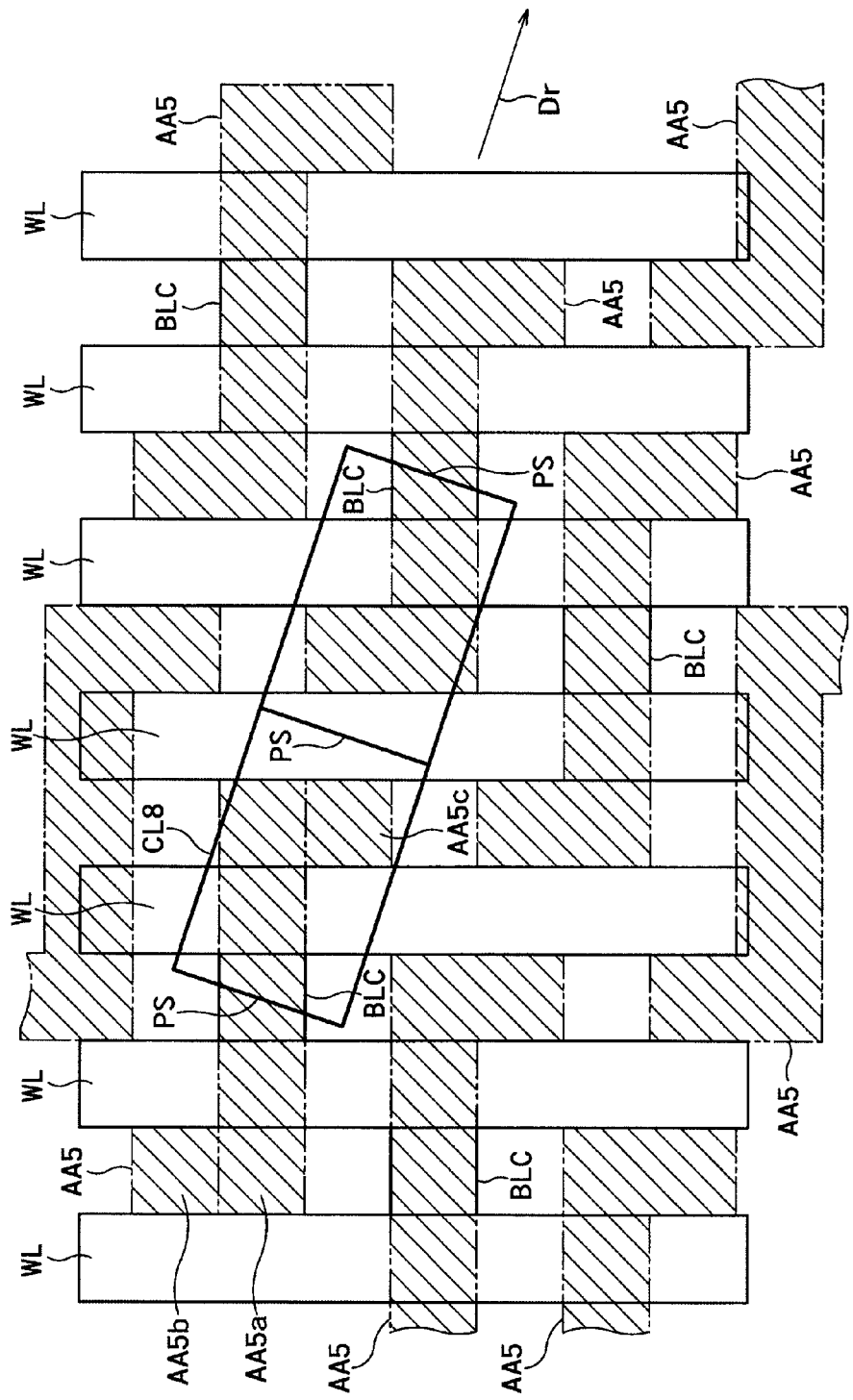
FIG. 24 is a plan view showing a principal portion in a layout of a semiconductor memory device according to a fifth embodiment of the invention.

FIG. 24 is a plane view showing a principal portion in a layout of a semiconductor memory device according to a fifth embodiment of the invention. FIG. 24 shows a planar shape of a word line WL, a bit line contact BLC, and an element region AA5 in a ferroelectric memory according to the fifth embodiment. A layout of a ferroelectric film C4, the bit line contact BLC, and the word line WL, and a layout of a bit line BL3, a contact (LEC) between an impurity diffusion layer IDL and a lower electrode LE in the ferroelectric memory according to the fifth embodiment are substantially identical with FIGS. 18 and 21, respectively.

As shown in FIG. 24, a feature of the ferroelectric memory according to the fifth embodiment is that the element region AA5 is not obliquely arranged, and is formed in the direction perpendicular to the word line WL and in the direction parallel to the word line WL.

Specifically, the element region AA5 includes a first portion AA5a perpendicular to the word line WL, and second portions AA5b, AA5c which are continuous with both ends of the first portion and extend parallel to the word line WL. The second portions AA5b, AA5c are arranged in such a manner as to extend toward the opposite directions to each other while being parallel to the word line WL. Furthermore, element regions in memory cells CL8 which are adjacent to each other in the row direction Dr are arranged in such a manner as to be rotationally symmetric with each other around a middle point PS on the boundary line of the memory cells CL8.

With the fifth embodiment, the element region AA5 is not obliquely arranged and is arranged in such a manner as to be parallel to or perpendicular to the word line WL. Accordingly, manufacturing steps such as tests during the manufacturing process and etching by photolithography and RIE become easy in comparison with the third embodiment. Meanwhile, the planar shape and the size of a ferroelectric film C4 is substantially identical with the third embodiment. Accordingly, with the fifth embodiment, it is possible to increase the signal amount by 60% in comparison with the conventional example.

Other embodiments of the present disclosure will be apparent to those skilled in the art from consideration of the specification and practice of the disclosure disclosed herein. It is intended that the specification and example embodiments be considered as exemplarily only, with a true scope and spirit of the disclosure being indicated by the claims that follow. The disclosure can be carried out by being variously modified within a range not deviated from the gist of the disclosure.

What is claimed is:

1. A semiconductor memory device comprising a ferroelectric capacitor comprising:
    a substrate;
    a field effect transistor comprising a word line on the substrate via an insulating layer and a pair of impurity diffusion layers in an element region in a surface layer of the substrate, the word line being interposed between the pair of impurity diffusion layers;
    a ferroelectric capacitor above the substrate, the ferroelectric capacitor comprising a lower electrode connected to a first one of the pair of the impurity diffusion layers, a ferroelectric film on the lower electrode, and an upper electrode on the ferroelectric film; and
    a bit line below the lower electrode, the bit line connecting to a second one of the pair of impurity diffusion layers via a bit line contact;
    wherein each of memory cells comprises the field effect transistor and the ferroelectric capacitor, a memory cell group comprises the memory cells in a first direction with a predetermined pitch, and memory cells in the group are aligned in rows in a second direction,
    each memory cell is configured to share the bit line contact with an adjacent memory cell at one side in the first direction and to connect to the bit line, and
    three of the word lines are disposed between the bit line contacts in the first direction; and
    wherein the bit line is at an acute angle to the first direction, and the ferroelectric capacitor is substantially perpendicular to the word line.

2. The semiconductor memory device of claim 1, wherein the memory cells are at an acute angle to a direction in parallel to the bit line.

3. The semiconductor memory device of claim 2, wherein the element region comprises a first portion perpendicular to the word line, and a second portion continuous to the first portion and extending in parallel to the word line.

4. The semiconductor memory device of claim 1, wherein sizes of the ferroelectric capacitor are twice as much as the minimum processing size in the first direction and 1.83 times as much as the minimum processing size in the second direction.

5. The semiconductor memory device of claim 1, wherein a width of the bit line is smaller than the minimum processing size.

6. The semiconductor memory device of claim 5, wherein sizes of the ferroelectric capacitor are twice as much as the minimum processing size in the first direction and 1.66 times as much as the minimum processing size in the second direction.

7. The semiconductor memory device of claim 1, wherein the memory cell in the first direction is formed shifted by a predetermined distance in the first direction with respect to an adjacent memory cell in the second direction.

8. The semiconductor memory device of claim 7, wherein a distance of the shift amount is half of the predetermined distance.

9. The semiconductor memory device of claim 1, wherein the lower electrode comprises iridium.

10. The semiconductor memory device of claim 1, wherein the ferroelectric film comprises PZT or SBT.

11. The semiconductor memory device of claim 1, wherein the upper electrode comprises iridium, iridium oxide, or platinum.

* * * * *